(12) United States Patent
Naito et al.

(10) Patent No.: US 9,368,685 B2
(45) Date of Patent: Jun. 14, 2016

(54) SEMICONDUCTOR LIGHT EMITTING DEVICE, METHOD OF MANUFACTURING THE SAME, IMAGE DISPLAY DEVICE, AND ELECTRONIC APPARATUS

(71) Applicant: Sony Corporation, Tokyo (JP)

(72) Inventors: Hiroki Naito, Kanagawa (JP); Takahiro Koyama, Kanagawa (JP); Kensuke Kojima, Kanagawa (JP); Arata Kobayashi, Kanagawa (JP); Hiroyuki Okuyama, Kanagawa (JP); Makoto Oogane, Miyagi (JP); Takayuki Kawasumi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 186 days.

(21) Appl. No.: 13/909,857

(22) Filed: Jun. 4, 2013

(65) Prior Publication Data

US 2013/0285080 A1 Oct. 31, 2013

Related U.S. Application Data

(63) Continuation of application No. 12/877,534, filed on Sep. 8, 2010, now abandoned.

(30) Foreign Application Priority Data

Sep. 15, 2009 (JP) .................. 2009-213194

(51) Int. Cl.
*H01L 33/00* (2010.01)
*H01L 33/30* (2010.01)
(Continued)

(52) U.S. Cl.
CPC .............. *H01L 33/30* (2013.01); *H01L 27/156* (2013.01); *H01L 33/38* (2013.01); *H01L 33/0062* (2013.01); *H01L 33/20* (2013.01); *H01L 33/62* (2013.01); *H01L 2924/0002* (2013.01); *H01L 2933/0016* (2013.01)

(58) Field of Classification Search
CPC .... H01L 33/30; H01L 33/0062; H01L 27/156
USPC .................... 257/88, 94, 79, 98, 103, E21.04, 257/E33.013; 438/46, 37, 47, 22
See application file for complete search history.

(56) References Cited

U.S. PATENT DOCUMENTS

| | | | | |
|---|---|---|---|---|
| 5,153,889 A | * | 10/1992 | Sugawara et al. | 372/45.01 |
| 2003/0138981 A1 | * | 7/2003 | Yamaguchi et al. | 438/22 |

(Continued)

FOREIGN PATENT DOCUMENTS

| | | |
|---|---|---|
| JP | 04-229665 | 8/1992 |
| JP | 05-121722 | 5/1993 |

(Continued)

OTHER PUBLICATIONS

Japanese Office Action issued in connection with related Japanese Patent Application No. 2009-213194 dated Jul. 9, 2013.

(Continued)

*Primary Examiner* — Cuong Q Nguyen
(74) *Attorney, Agent, or Firm* — Dentons US LLP

(57) ABSTRACT

A semiconductor light emitting device including an active layer, a compound semiconductor layer on the active layer, a contact layer on the compound semiconductor layer, and an electrode on the contact layer, where the contact layer is substantially the same size as the electrode.

27 Claims, 32 Drawing Sheets

(51) Int. Cl.
  *H01L 33/38* (2010.01)
  *H01L 27/15* (2006.01)
  *H01L 33/20* (2010.01)
  *H01L 33/62* (2010.01)

(56) References Cited

U.S. PATENT DOCUMENTS

| | | | | |
|---|---|---|---|---|
| 2004/0095979 | A1* | 5/2004 | Onishi et al. | 372/45 |
| 2005/0001226 | A1 | 1/2005 | Chen | |
| 2005/0258434 | A1* | 11/2005 | Abe et al. | 257/79 |
| 2008/0265275 | A1 | 10/2008 | Hanamaki et al. | |

FOREIGN PATENT DOCUMENTS

| | | |
|---|---|---|
| JP | 07-015038 | 1/1995 |
| JP | 07-231116 | 8/1995 |
| JP | 10-214996 | 8/1998 |
| JP | 2000-307184 | 11/2000 |
| JP | 2002-335048 | 11/2002 |
| JP | 2003-46118 | 2/2003 |
| JP | 2003-243707 | 8/2003 |
| JP | 2003-243773 | 8/2003 |
| JP | 2003-338635 | 11/2003 |
| JP | 2006-065011 | 3/2006 |
| JP | 2007-165535 | 6/2007 |
| JP | 2007-227801 | 9/2007 |
| JP | 2007-250958 | 9/2007 |
| JP | 2008-177393 | 7/2008 |
| WO | 20041082033 | 9/2004 |

OTHER PUBLICATIONS

Japanese Office Action in Japanese counterpart application No. JP2009-213194 dated Jan. 29, 2013.

* cited by examiner

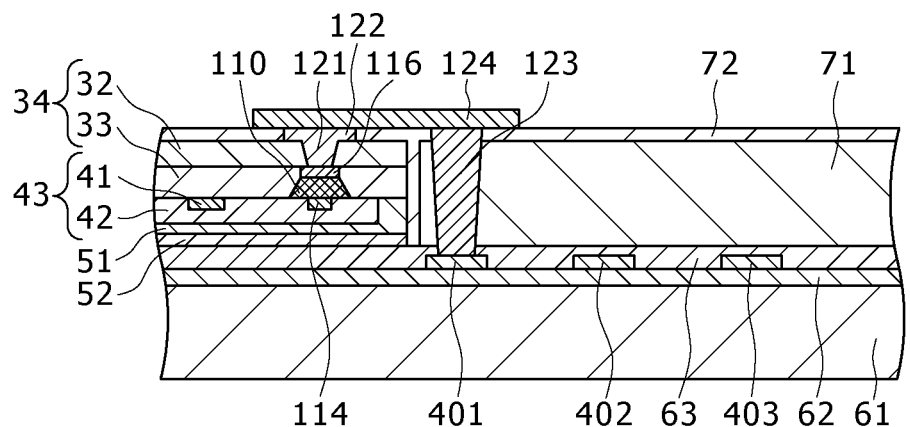
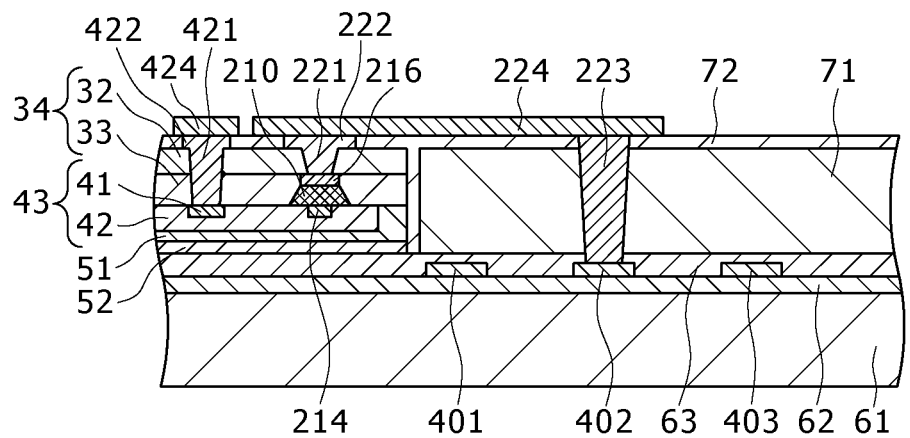
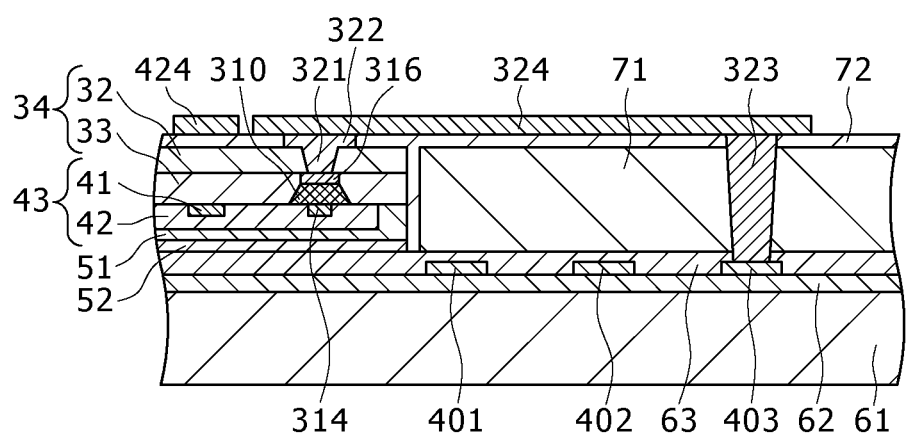

SEMICONDUCTOR LIGHT EMITTING DEVICE, METHOD OF MANUFACTURING THE SAME, IMAGE DISPLAY DEVICE, AND ELECTRONIC APPARATUS

RELATED APPLICATION DATA

This application is a continuation of U.S. patent application Ser. No. 12/877,534 filed Sep. 8, 2010, the entirety of which is incorporated herein by reference to the extent permitted by law. The present application claims the benefit of priority to Japanese Patent Application No. JP 2009-213194 filed on Sep. 15, 2009 in the Japan Patent Office, the entirety of which is incorporated by reference herein to the extent permitted by law.

BACKGROUND OF THE INVENTION

1. Field of the Invention

The present invention relates to a semiconductor light emitting device, a method of manufacturing the same, an image display device, and an electronic apparatus.

2. Description of the Related Art

A semiconductor light emitting device has an active layer operable to generate light, and light generated in the active layer is emitted. Such semiconductor light emitting devices are widely utilized in various technical fields and uses, such as display devices. For instance, starting from a semiconductor light emitting device which has an active layer composed of an AlGaInP compound semiconductor having a wide energy band, light emitting diodes (LEDs) operable to generate light at wavelengths of about 560 to 680 nm can be obtained by changing the crystal mixing ratio in the active layer. This is why the semiconductor light emitting devices are in wide use for display devices such as light emitting diode display devices.

Such a semiconductor light emitting device having the active layer composed of an AlGaInP compound semiconductor, in general, has a structure in which an n-type AlGaInP layer, an undoped active layer and a p-type AlGaInP layer are stacked, and light is generated by injecting a current into the undoped active layer. Incidentally, it may be necessary to form a metallic electrode (n-side electrode) for injecting electrons into the n-type AlGaInP layer, and to form a metallic electrode (p-side electrode) for injecting holes into the p-type AlGaInP layer. Further, there has been known a technology of forming a GaAs layer, for reducing the barrier wall between the electrode and the AlGaInP layer and for obtaining good electrical characteristics. However, the band gap in the GaAs layer is smaller than the band gap in the undoped active layer composed of the AlGaInP compound semiconductor layer, so that the light generated in the active layer would be absorbed by the GaAs layer, resulting in a lowered luminous efficiency.

For solving such a problem and realizing a high luminous efficiency, there has been known a technology of forming a p-type GaP layer, in place of the p-type GaAs layer, between the p-type AlGaInP layer and the p-side electrode (refer to, for example, Japanese Patent Laid-open No. 2008-177393). The GaP layer does not absorb the light generated in the active layer, so that the light can be taken out efficiently.

However, it is difficult to introduce a p-type impurity into the p-type GaP layer in a high concentration. Therefore, it may be necessary, for lowering sheet resistance, to set the thickness of the p-type GaP layer at a value of not less than 10 times the thickness of the p-type GaAs layer. However, it is extremely difficult to etch such a thick p-type GaP layer by wet etching, for manufacturing a semiconductor light emitting device having a minute size, especially a size of less than 1000 μm².

On the other hand, even in the case of forming the p-type GaAs layer between the p-type AlGaInP layer and the p-side electrode, manufacture of a semiconductor light emitting device having a minute size, particularly, a size of less than 1000 μm² necessarily results in that the p-type GaAs layer has a reduced size. As a result, the electric resistance of the p-type GaAs layer is raised, and a driving voltage is raised accordingly.

In a method of manufacturing a nitride semiconductor laser device, there may occur a problem in which a top surface (a contact surface for contact with a second electrode) of a second contact layer is contaminated to cause an increase in electric resistance, resulting in a raised operating voltage. In order to obviate such a problem, there has been known a technology for obtaining a nitride semiconductor laser device in which formation of a second contact layer is immediately followed by formation of a second electrode on the second contact layer so that, at the interface of the second contact layer and the second electrode, the second electrode has substantially the same width as the width of the second contact layer, as disclosed in Japanese Patent Laid-open No. 2002-335048. However, the semiconductor laser device disclosed in the patent laid-open document is a nitride semiconductor laser device. Moreover, the document makes no mention of measures to solve the problem encountered in wet etching of a thick p-type GaP layer formed as a contact layer or the problem of a rise in the driving voltage attendant on an increase in the electric resistance of the p-type GaAs layer.

Thus, there is a need for a semiconductor light emitting device and a manufacturing method therefor wherein no problem would occur in processing a semiconductor light emitting device by a wet etching technique and wherein a rise in a driving voltage is obviated. Also, there is a need for an image display device and an electronic apparatus in which such a semiconductor light emitting device is used.

SUMMARY OF THE INVENTION

In order to meet the above-mentioned needs, according to an embodiment of the present invention, there is provided a semiconductor light emitting device including a semiconductor light emitting device comprising an active layer, a compound semiconductor layer on the active layer, a contact layer on the compound semiconductor layer, and an electrode on the contact layer, where the contact layer is substantially the same size as the electrode.

Another embodiment consistent with the present invention includes a semiconductor light emitting device where the contact layer is smaller than the compound semiconductor layer.

Another embodiment consistent with the present invention includes a semiconductor light emitting device where the electrode covers the contact layer.

Another embodiment consistent with the present invention includes a semiconductor light emitting device where the average area $S_1$ of contact layer and the average area $S_2$ of the electrode satisfy the relation of $½ \leq S_2/S_1 \leq 2$.

Another embodiment consistent with the present invention includes a semiconductor light emitting device where the average area $S_1$ of the contact layer and the average area $S_2$ of the electrode satisfy the relation of $S_2/S_1 = 1.05$.

Another embodiment consistent with the present invention includes a semiconductor light emitting device where the active layer has a multiple quantum well structure which includes at least one well layer having $Ga_ZIn_{(1-Z)}P$ and at least one barrier wall layer having $Al_{X'}Ga_{Y'}In_{(1-X'-Y')}$, where Z=0.51, X'=0.30, and Y'=0.21.

Another embodiment consistent with the present invention includes a semiconductor light emitting device where the well layers and the barrier wall layers of the active layer are doped with Se in a concentration of $5\times10^{16}$/cm$^3$ Another embodiment consistent with the present invention includes a semiconductor light emitting device where the contact layer is doped with Zn in a concentration of $1\times10^{20}$/cm$^3$.

Another embodiment consistent with the present invention includes a semiconductor light emitting device where the contact layer is doped with Mg in a concentration of $1\times10^{18}$/cm$^3$.

Another embodiment consistent with the present invention includes a semiconductor light emitting device where the light emission wavelength λ of the active layer is between 560 and 680 nm.

Another embodiment consistent with the present invention includes a light emitting diode comprising an active layer, a compound semiconductor layer on the active layer, a contact layer on the compound semiconductor layer, and an electrode on the contact layer, where the contact layer is substantially the same size as the electrode;

Another embodiment consistent with the present invention includes a light emitting diode where the contact layer is smaller than the compound semiconductor layer.

Another embodiment consistent with the present invention includes a light emitting diode where the electrode covers the contact later.

Another embodiment consistent with the present invention includes a light emitting diode where the average area $S_1$ of contact layer and the average area $S_2$ of the electrode satisfying the relation of $\frac{1}{2} \leq S_2/S_1 \leq 2$.

Another embodiment consistent with the present invention includes a light emitting diode where the average area $S_1$ of the contact layer and the average area $S_2$ of the electrode satisfy the relation of $S_2/S_1 = 1.05$.

Another embodiment consistent with the present invention includes a light emitting diode where the active layer has a multiple quantum well structure which includes at least one well layer having $Ga_ZIn_{(1-Z)}P$ and at least one barrier wall layer having $Al_{X'}Ga_{Y'}In_{(1-X'-Y')}$, where Z=0.51, X'=0.30, and Y'=0.21.

Another embodiment consistent with the present invention includes a light emitting diode where the well layers and the barrier wall layers are doped with Se in a concentration of $5\times10^{16}$/cm$^3$ Another embodiment consistent with the present invention includes a light emitting diode where the contact layer is doped with Zn in a concentration of $1\times10^{20}$/cm$^3$.

Another embodiment consistent with the present invention includes a light emitting diode where the contact layer is doped with Mg in a concentration of $1\times10^{18}$/cm$^3$.

Another embodiment consistent with the present invention includes a light emitting diode where the light emission wavelength λ of the active layer is between 560 and 680 nm.

BRIEF DESCRIPTION OF THE DRAWINGS

FIG. 6 illustrates the outline of an evaluating method for the semiconductor light emitting device according to Example 1 and the like;

FIGS. 8A, 8B and 8C are schematic partial sectional views respectively taken along arrow A-A, arrow B-B and arrow C-C of FIG. 7, of one light emitting unit in the light emitting diode display device according to Example 2;

DETAILED DESCRIPTION OF THE PREFERRED EMBODIMENTS

Figure 1A:
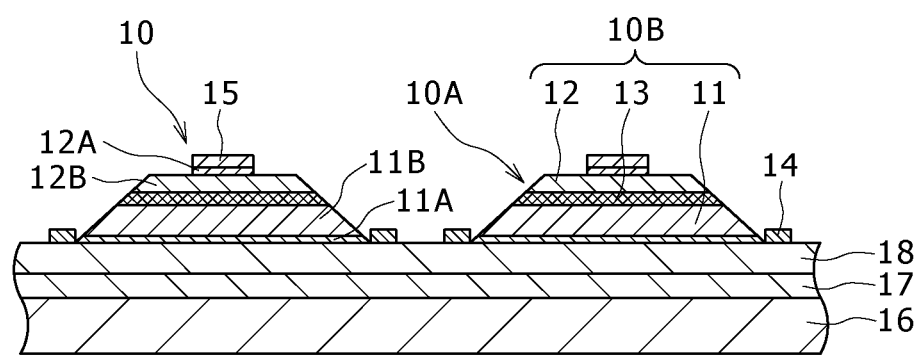
FIGS. 1A and 1B are a schematic partial sectional view and a conceptual view of a semiconductor light emitting device according to Example 1 of the present invention.

Now, the present invention will be described below, based on examples thereof and referring to the drawings. The invention, however, is not to be limited to the examples, and various numerical values and materials in the examples are given merely for exemplification.

[General Description of the Semiconductor Light Emitting Device, the Method of Manufacturing the Same, the Image Display Device, and the Electronic Apparatus According to Embodiments of the Present Invention]

In the semiconductor light emitting device according to an embodiment of the present invention, the method of manufacturing the light emitting device according to an embodiment of the invention, the image display device according to an embodiment of the invention or the electronic apparatus according to an embodiment of the invention, a first conduction type may be n-type, a second conduction type may be p-type, and an active layer may be doped with an n-type impurity. In this case, the doping concentration of the n-type impurity in the active layer is desirably in the range of $5\times10^{15}/cm^3$ to $1\times10^{18}/cm^3$, and preferably $1\times10^{16}/cm^3$ to $1\times10^{18}/cm^3$. Incidentally, the first conduction type, the second conduction type, and the conduction type of the active layer are not limited to the just-mentioned ones. Other examples of the combination of (the first conduction type, the second conduction type, the conduction type of the active layer) include (n-type, p-type, p-type), (p-type, n-type, n-type), and (p-type, n-type, p-type).

In the semiconductor light emitting device according to an embodiment of the present invention, the image display device according to an embodiment of the invention or the electronic apparatus according to an embodiment of the invention including the above-mentioned preferred modes, the area of the active layer is desirably not more than $1\times10^{-9}$ $m^2$ ($1\times10^3$ $\mu m^2$), though this is not limitative. Further, in the semiconductor light emitting device according to an embodiment of the present invention, the method of manufacturing the light emitting device according to an embodiment of the invention, the image display device according to an embodiment of the invention and the electronic apparatus according to an embodiment of the invention including the above-mentioned preferred modes, the area of the active layer is preferably in the range of $1\times10^{-11}$ to $5\times10^{-10}$ $m^2$, more preferably in the range of $3\times10^{-11}$ to $3\times10^{-10}$ $m^2$.

In the method of manufacturing the semiconductor light emitting device according to an embodiment of the present invention inclusive of the above-mentioned various preferred modes, desirably, the etching rate $ER_U$ in wet etching of the second GaAs layer and the etching rate $ER_L$ of the second AlGaInP compound semiconductor layer in wet etching of the second GaAs layer satisfy the relation of:

$ER_U/ER_L \geq 1\times10^2$, preferably $ER_U/ER_L \geq 3\times10^2$.

In addition, it is preferable to carry out wet etching of the second GaAs layer while using the patterned second electrode as an etching mask.

In the semiconductor light emitting device according to an embodiment of the present invention, the method of manufacturing the light emitting device according to an embodiment of the invention, the image display device according to an embodiment of the invention or the electronic apparatus according to an embodiment of the invention inclusive of the above-described preferred modes (hereinafter, these may be generically referred to simply as "the present invention"), the size of the second GaAs layer is smaller than the size of the second AlGaInP compound semiconductor layer and substantially the same as the size of the second electrode. Here, the expression "substantially the same as" means that the average area $S_1$ of the second GaAs layer and the average area $S_2$ of the second electrode satisfy the relation of: $1/2 \leq S_2/S_1 \leq 2$.

Besides, it is desirable that the average area $S_3$ of the second AlGaInP compound semiconductor layer satisfies the relation of:

$$1/200 \leq S_2/S_3 \leq 1/3,$$

preferably $$1/50 \leq S_2/S_3 \leq 1/5.$$

Examples of the light emission wavelength of the semiconductor light emitting device according to an embodiment of the present invention include wavelengths in the range of 560 to 680 nm.

Examples of the semiconductor light emitting device in the present invention include light emitting diodes (LEDs) and semiconductor lasers. Examples of the electronic apparatus in the present invention include light emitting diode display devices, backlights in which light emitting diodes are used, light emitting diode illumination devices, and advertising media. The electronic apparatus may basically be any one, inclusive of both portable ones and stationary ones, and specific examples thereof include cellular phones, mobile apparatuses, robots, personal computers, on-vehicle apparatuses, and various domestic electrical equipments and appliances. The semiconductor light emitting devices used to constitute the electronic apparatus or the image display device are in plurality. The number, kinds, mounting (layout), interval and the like of the semiconductor light emitting devices are determined according to the use and function of the electronic apparatus, the specifications required of the electronic apparatus or the image display device, etc. The semiconductor light emitting device according to an embodiment of the present invention may be used as a red light emitting diode. On the other hand, a green light emitting diode and a blue light emitting diode may be composed, for example, of a GaN semiconductor light emitting device including a GaN compound semiconductor layer.

The image display device or the electronic apparatus according to an embodiment of the present invention, specifically, includes:

(a) a plurality of first wirings extending in a first direction;

(b) a plurality of second wirings extending in a second direction different from the first direction; and (c) a plurality of the semiconductor light emitting devices each of which has a first electrode electrically connected to the first wiring and a second electrode electrically connected to the second wiring.

In the image display device according to an embodiment of the present invention, each of the plurality of first wirings is belt-like in overall shape and extends in the first direction, whereas each of the plurality of second wirings is belt-like in overall shape and extends in the second direction different from the first direction (for example, in a direction orthogonal to the first direction). Incidentally, the wiring which is belt-like in overall shape may have a trunk wire extending in a belt-like shape and a plurality of branch wires extending from the trunk wire.

On the other hand, the electronic apparatus according to an embodiment of the present invention may have a configuration wherein the first wiring includes a plurality of wires, each of which extends in the first direction as a whole, and the second wiring also includes a plurality of wires, each of which extends in the second direction different from the first direction (for example, in a direction orthogonal to the first direction) as a whole. Or, alternatively, a configuration may be adopted wherein the first wiring includes a common wire (common electrode), whereas the second wiring includes a plurality of wires, each of which extends in one direction as a whole. Or, further, a configuration may be adopted wherein the first wiring includes a plurality of wires, each of which extends in one direction as a whole, whereas the second wiring includes a common wire (common electrode). Or, furthermore, a configuration may be adopted in which the first wiring has a common wire (common electrode) and the second wiring also has a common wire (common electrode). Incidentally, the wiring may include, for example, a trunk wire and a plurality of branch wires extending from the trunk wire.

Examples of the material for the first wiring and the second wiring include: various metals such as gold (Au), silver (Ag), copper (Cu), palladium (Pd), platinum (Pt), chromium (Cr), nickel (Ni), cobalt (Co), zirconium (Zr), aluminum (Al), tantalum (Ta), niobium (Nb), molybdenum (Mo), tungsten (W), titanium (Ti), iron (Fe), indium (In), zinc (Zn), tin (Sn), etc.; alloys (e.g., MoW) or compounds (e.g., TiW; nitrides such as TiN, WN, etc.; silicides such as $WSi_2$, $MoSi_2$, $TiSi_2$, $TaSi_2$, etc.) containing any of these metals; conductive particles of any of these metals; conductive particles of alloys containing any of these metals; semiconductors such as silicon (Si), etc.; thin film of carbon such as diamond, etc.; and conductive metallic oxides such as ITO (indium tin oxide), indium oxide, zinc oxide, etc. Other examples include stacked structures of layers containing any of these elements. Further examples include organic materials (conductive polymers) such as poly (3,4-ethylenedioxythiophene)/polystyrenesulfonic acid [PEDOT/PSS]. Examples of the method for forming the first wiring and the second wiring, which naturally depends on the material constituting the wirings, include: various physical vapor deposition methods (PVD methods) including vacuum evaporation methods such as electron beam vapor deposition, hot-filament vapor deposition, etc., sputtering, ion plating, laser ablation, etc.; various chemical vapor deposition methods (CVD methods) including MOCVD method; spin coating method; various printing methods such as screen printing, ink jet printing, offset printing, metal mask printing, gravure printing, etc.; various coating methods such as air doctor coating method, blade coater method, rod coater method, knife coater method, squeeze coater method, reverse roll coater method, transfer roll coater method, gravure coater method, kiss coater method, cast coater method, spray coater method, slit orifice coater method, calender coater method, dipping method, etc; stamping method; lift-off method; shadow mask method; plating methods such as electroplating, electroless plating or a combination of them; lift-off method; sol-gel method; spraying method, and so on, which may be combined with a patterning technology, as required. Incidentally, examples of the PVD methods include (a) various vacuum evaporation methods such as electron beam heating method, resistance heating method, flash evaporation, etc., (b) plasma vapor deposition method, (c) various sputtering methods such as two-pole sputtering, DC (direct current) sputtering, DC magnetron sputtering, high-frequency sputtering, magnetron sputtering, ion beam sputtering, bias sputtering, etc., and (d) various ion plating methods such as DC method, RF method, multi-cathode method, activated reaction method, field evaporation method, high-frequency ion plating method, reactive ion plating method, etc. The material constituting the first wiring and the material constituting the second material may be the same or different from each other. Besides, by appropriately selecting the method of forming the wirings, patterned first and second wirings can be directly formed.

The compound semiconductor constituting the upper layer of the first compound semiconductor layer and the lower layer of the second compound semiconductor layer in the present invention is an AlGaInP compound semiconductor, as above-mentioned, and is, specifically, an $Al_XGa_YIn_{(1-X-Y)}P$ compound semiconductor. On the other hand, the compound semiconductor constituting the active layer is a $Ga_ZIn_{(1-Z)}P$ compound semiconductor, as above-mentioned. Here, X, Y, and Z are preferably so set as to satisfy, for example, the following relations.

$0.1 \leq X \leq 0.4$ $0.1 \leq Y \leq 0.4$ $0.4 \leq X+Y \leq 0.6$ $0.4 < Z \leq 0.6$ Where the first conduction type is n-type, examples of the n-type impurity include silicon (Si), selenium (Se), germanium (Ge), tin (Sn), carbon (C), and titanium (Ti). Besides, where the second conduction type is p-type, examples of the p-type impurity include zinc (Zn), magnesium (Mg), beryllium (Be), cadmium (Cd), calcium (Ca), barium (Ba), and oxygen (O). The active layer may be composed of a single compound semiconductor layer, or may have a single quantum well structure [QW structure] or a multiple quantum well structure [MQW structure]. Examples of the forming method (film forming method) for the various compound semiconductor layers inclusive of the active layer include metal organic chemical vapor deposition methods (MOCVD method, MOVPE method), a metal organic molecular beam epitaxy method (MOMBE method), and a hydride vapor phase epitaxy method (HYPE method) in which a halogen contributes to transport or reaction.

Here, in the case where the formation (crystal growth) of the compound semiconductor layer is based on the MOCVD method, examples of a gallium (Ga) source in forming the compound semiconductor layer include trimethylgallium (TMG) gas and triethylgallium (TEG) gas, whereas examples of an arsenic (As) source include tertiary butylarsine (TBAs) gas and arsine ($AsH_3$) gas, and examples of a phosphorus (P) source include tertiary butylphosphine (TBP) gas and phosphine ($PH_3$) gas. In addition, trimethylaluminum (TMA) gas may be used as an aluminum (Al) source, and trimethylindium (TMI) gas may be used as an indium (In) source. In the case where silicon (Si) is used as the n-type impurity (n-type dopant), monosilane ($SiH_4$) gas may be used as a Si source. Where selenium (Se) is used as the n-type impurity (n-type dopant), hydrogen selenide ($SeH_4$) gas may be used as a Se source. In the case where magnesium (Mg) is used as a p-type impurity (p-type dopant), cyclopentadienylmagnesium gas, methylcyclopentadienylmagnesium, or bis(cyclopentadienyl)magnesium ($Cp_2Mg$) may be used as a Mg source. Where zinc (Zn) is used as the p-type impurity (p-type dopant), dimethylzinc (DMZ) gas may be used as a Zn source.

In order to electrically connect the first electrode to the first compound semiconductor layer, for example, the first electrode may be so formed as to make contact with the first compound semiconductor layer (specifically, the first GaAs layer). In some cases, the first electrode may be formed on a substrate for manufacture of the light emitting device, the substrate having been provided with the first compound semiconductor layer. The second electrode is formed on the second GaAs layer. Hereinafter, for convenience, the electrode electrically connected to the compound semiconductor layer doped with the p-type impurity may be referred to as "p-side electrode," whereas the electrode electrically connected to the compound semiconductor layer doped with the n-type impurity may be referred to as "n-side electrode." Here, examples of the p-side electrode include Au/AuZn, Au/Pt/Ti(/Au)/AuZn, Au/Pt/TiW(/Ti)(/Au)/AuZn, Au/AuPd, Au/Pt/Ti(/Au)/AuPd, Au/Pt/TiW(/Ti)(/Au)/AuPd, Au/Pt/Ti, Au/Pt/TiW(/Ti), Au/Pt/TiW/Pd/TiW(/Ti), Ti/Cu, Pt, Ni, Ag, Ag/Ni, and Ge. Besides, examples of the n-side electrode include Au/Ni/AuGe, Au/Pt/Ti(/Au)/Ni/AuGe, AuGe/Pd, Au/Pt/TiW(/Ti)/Ni/AuGe, Ti, and Ti/Al. Incidentally, the layer on the more precedent side of "/" is located at a position electrically more distant from the active layer. Or, alternatively, the n-side electrode may be formed by use of a transparent conductive material such as ITO, IZO, ZnO:Al, ZnO:B, etc. In the case where a layer formed from a transparent conductive material is used as a current diffusion layer, the n-side electrode may have a structure in which the metallic stacked structure above-mentioned as the p-side electrode and the current diffusion layer are combined with each other.

Examples of the substrate for manufacture of the light emitting device include GaAs substrate, GaP substrate, AlN substrate, AlP substrate, InN substrate, InP substrate, AlGaInN substrate, AlGaN substrate, AlInN substrate, GaInN substrate, AlGaInP substrate, AlGaP substrate, AlInP substrate, GaInP substrate, ZnS substrate, sapphire substrate, SiC substrate, alumina substrate, ZnO substrate, LiMgO substrate, $LiGaO_2$ substrate, $MgAl_2O_4$ substrate, Si substrate, Ge substrate, and those obtained by forming an underlying layer or a buffer layer on a surface (principal surface) of any of these substrates.

Example 1

Figure 1B:
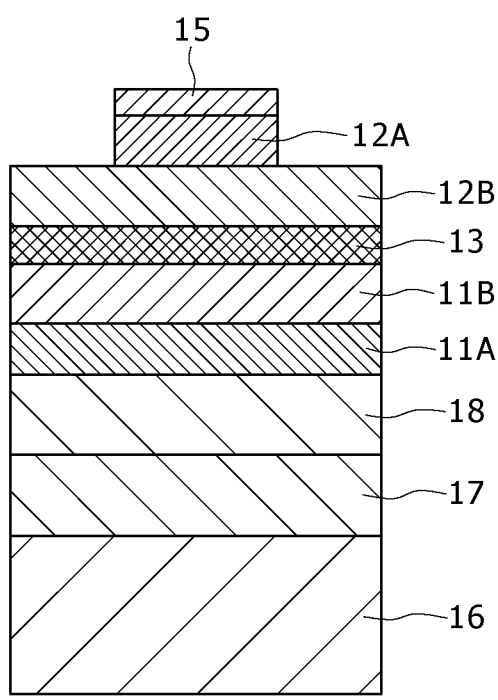

Example 1 relates to a semiconductor light emitting device according to an embodiment of the present invention and a method of manufacturing a semiconductor light emitting device according to an embodiment of the invention. A schematic partial sectional view of a semiconductor light emitting device according to Example 1 (specifically, a light emitting diode (LED) in Example 1) is shown in FIG. 1A, and a conceptual view of the same is shown in FIG. 1B.

An AlGaInP compound semiconductor light emitting device (light emitting diode 10) as the semiconductor light emitting device in Example 1 includes:

(A) a stacked structure 10B including a first compound semiconductor layer 11 which has a first conduction type (specifically, n-type) and includes a first GaAs layer (first contact layer) 11A and a first AlGaInP compound semiconductor layer (first clad layer) 11B stacked in this order from the lower side, an active layer 13 having a GaInP compound semiconductor layer, and a second compound semiconductor layer 12 which has a second conduction type (specifically, p-type) different from the first conduction type and includes a second AlGaInP compound semiconductor layer (second clad layer) 12B and a second GaAs layer (second contact layer) 12A stacked in this order from the lower side;

(B) a first electrode 14 electrically connected to the first GaAs layer 11A; and (C) a second electrode 15 formed over the second GaAs layer 12A.

Besides, the active layer 13 is doped with an impurity, and the size of the second GaAs layer 12A is smaller than the size of the second AlGaInP compound semiconductor layer 12B and substantially the same as the size of the second electrode 15.

More specifically, the compound semiconductor layers constituting the stacked structure 10B have the following compositions.

The first GaAs layer (first contact layer) 11A has a thickness of 50 nm, and is doped with Se in a doping concentration of $1 \times 10^{18}/cm^3$. In addition, the first AlGaInP compound semiconductor layer (first $Al_X Ga_Y In_{(1-X-Y)}P$ compound semiconductor layer; first clad layer) 11B has a thickness of 1 µm, and is doped with Se in a doping concentration of $5 \times 10^{17}/cm^3$, where X=0.35, and
Y=0.16.

Further, the active layer 13 has a multiple quantum well structure which includes well layer having $Ga_Z In_{(1-Z)}P$ and barrier wall layers having $Al_{X'} Ga_{Y'} In_{(1-X'-Y')}$, where Z=0.51,
X'=0.30, and
Y'=0.21, with the number of the well layers being 15 and the number of the barrier wall layers being 14. Besides, the well layers and the barrier wall layers constituting the active layer 13 are doped with Se in a doping concentration of $5 \times 10^{16}/cm^3$. Here, the light emission wavelength λ of the active layer 13 is 635 nm. The proportion (compositional ratio) of In in the well layers may be determined based on the desired light emission wavelength.

In addition, the second AlGaInP compound semiconductor layer (second $Al_X Ga_Y In_{(1-X-Y)}P$ compound semiconductor layer; second clad layer) 12B has a thickness of 1 µm, and is doped with Mg in a doping concentration of $1 \times 10^{18}/cm^3$. Further, the second GaAs layer (second contact layer) 12A has a thickness of 50 nm, and is doped with Zn in a doping concentration of $1 \times 10^{20}/cm^3$. Here, X=0.35, and
Y=0.16.

Furthermore, the average area $S_1$ of the second GaAs layer 12B and the average area $S_2$ of the second electrode 15 satisfy the relation of:

$$S_2/S_1 = 1.05.$$

Figure 2A:
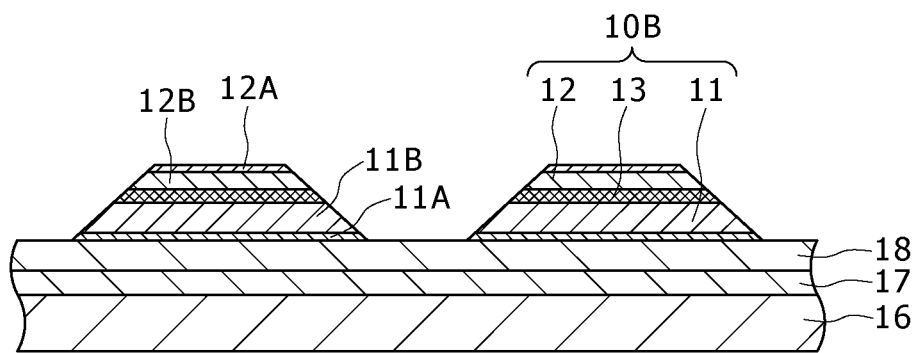
FIGS. 2A and 2B are schematic partial end views of a substrate and the like, for illustrating a method of manufacturing a semiconductor light emitting device according to Example 1.
Figure 2B:
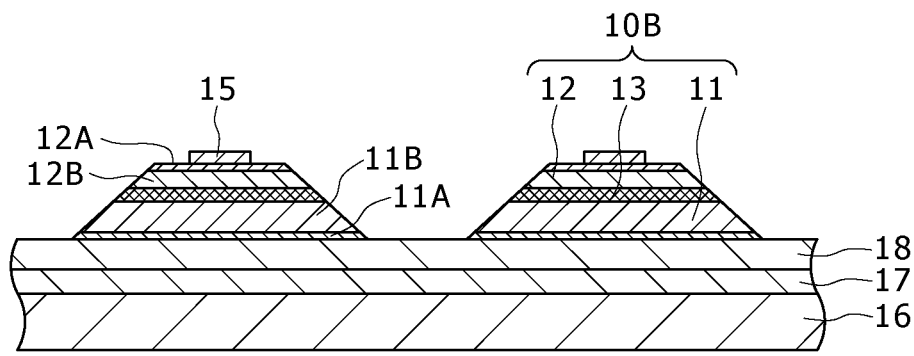

Now, the method of manufacturing a semiconductor light emitting device according to Example 1 will be described below, referring to FIGS. 2A and 2B which are schematic partial end views of a substrate and the like.

(Step 100)

First, a stacked structure 10B is formed.

[Step 100A]

Specifically, first, by use of an n-type GaAs substrate (doping concentration: $1 \times 10^{18}/cm^3$) having a (001) plane as a principal surface as a substrate 16 for manufacture of light emitting device (hereinafter, this substrate 16 may referred to simply as "substrate 16"), substrate cleaning is conducted at a substrate temperature of 800° C. in a carrier gas having hydrogen for 10 minutes, followed by lowering the substrate temperature to 720° C. Then, trimethylgallium (TMG) gas as a Ga source is supplied while supplying arsine ($AsH_3$) gas as an arsenic source and monosilane ($SiH_4$) gas as a Si source, based on the MOCVD method, whereby a buffer layer 17 having a GaAs layer and having a thickness of 0.5 µm is formed through crystal growth on the substrate 16. Incidentally, the doping concentration of the n-type impurity (Si) in the buffer layer 17 was set to $5 \times 10^{17}/cm^3$. Incidentally, Se may also be used as the n-type impurity.

[Step 100B]

Next, the supply of the $AsH_3$ gas is stopped, and TMG gas as a Ga source, trimethylaluminum (TMA) gas as an Al source, trimethylindium (TMI) gas as an In source and $SiH_4$ gas are supplied while supplying phosphine ($PH_3$) as a phosphorus source, whereby an etching stop layer 18 having an AlGaInP compound semiconductor and having a thickness of 0.5 µm is formed through crystal growth on the buffer layer 17. Incidentally, the doping concentration of the n-type impurity (Si) in the etching stop layer 18 was set to $5 \times 10^{17}/cm^3$. Incidentally, Se may also be used as the n-type impurity.

[Step 100C]

Thereafter, the supply of the TMG gas, TMA gas, TMI gas, $PH_3$ gas and $SiH_4$ gas is stopped, and TMG gas, $AsH_3$ gas and hydrogen selenide ($SeH_2$) gas as a Se source are supplied, whereby a first GaAs layer (first contact layer) 11A doped with an n-type impurity (Se) and having a thickness of 50 nm is formed through crystal growth. Incidentally, the doping concentration was set to $1 \times 10^{18}/cm^3$.

[Step 100D]

Next, the supply of the TMG gas, $AsH_3$ gas and $SeH_2$ gas is stopped, and TMG gas, TMA gas, TMI gas, $PH_3$ gas and $SeH_2$ gas are supplied, whereby a first AlGaInP compound semiconductor layer (first clad layer) 11B having a thickness of 1 µm is formed through crystal growth. Incidentally, the doping concentration was set to $5 \times 10^{17}/cm^3$.

[Step 100E]

Subsequently, while continuing the supply of $PH_3$ gas and $SeH_2$ gas, use is made of TMG gas, TMA gas and TMI gas and these gases are supplied by changing over valves, whereby an active layer 13 having a multiple quantum well structure which includes barrier wall layers having AlGaInP and well layers having GaInP is formed. Incidentally, the doping concentration was set to $5 \times 10^{16}/cm^3$.

[Step 100F]

Next, while continuing the supply of $PH_3$ gas, supply of TMG gas, TMA gas and TMI gas is continued, and, further, supply of bis(cyclopentadienyl)magnesium ($Cp_2Mg$) gas as a Mg source is started, whereby a second AlGaInP compound semiconductor layer (second clad layer) 12B is formed through crystal growth. Incidentally, the doping concentration of Mg was set to $1 \times 10^{18}/cm^3$.

[Step 100G]

Thereafter, the supply of the TMG gas, TMA gas, TMI gas, $PH_3$ gas and $SeH_2$ gas is stopped, and $AsH_3$ gas, TMG gas and dimethylzinc (DMZ) gas as a Zn source are supplied, whereby a second GaAs layer (second contact layer) 12A having a thickness of 50 nm is formed through crystal growth. Incidentally, the doping concentration was set to $1 \times 10^{20}/cm^3$. Next, the supply of the TMG gas and DMZ gas was stopped, and the substrate temperature was lowered. When the substrate temperature was lowered to 300° C., the supply of the $AsH_3$ gas was stopped, and the substrate temperature was lowered to room temperature, whereby the crystal growth was completed.

[Step 110]

After the crystal growth is thus completed, an annealing treatment is conducted in a nitrogen gas atmosphere so as to activate the p-type impurity (p-type dopant).

[Step 120]

Thereafter, an etching mask is formed over the stacked structure 11B by a photolithographic technique, and those portions of the second GaAs layer 12A which are not covered with the etching mask are etched away by use of a mixed solution of phosphoric acid, hydrogen peroxide and water. Where the mixed solution of phosphoric acid, hydrogen peroxide and water is used, the second AlGaInP compound semiconductor layer 12B is substantially not etched, and the second GaAs layer 12A is selectively etched away.

[Step 130]

Next, the second AlGaInP compound semiconductor layer 12B, the active layer 13 and the first AlGaInP compound semiconductor layer 11A are subjected to wet etching by use of hydrochloric acid, to achieve device isolation. In this case, since the first GaAs layer 11A is not etched with the hydrochloric acid, etching can be stopped at the stage where the first GaAs layer 11A is exposed. By controlling the size of the etching mask used and the etching time, it is possible to control the size of the semiconductor light emitting devices upon the device isolation. After the etching is over, the etching mask is removed. The size of the semiconductor light emitting device (the area of the active layer 13) upon the device separation was set to a value of not more than $1 \times 10^3$ μm$^2$, specifically, a value of 200 μm$^2$. In this manner, the condition shown in FIG. 2A can be obtained. Incidentally, the etching rate $ER_U$ in wet etching of the second GaAs layer 12A and the etching rate $ER_L$ of the second AlGaInP compound semiconductor layer 12B in wet etching of the second GaAs layer 12A (specifically, during the wet etching of the second GaAs layer 12A, the second AlGaInP compound semiconductor layer 12B can also be etched in the latter stage (final stage) of the wet etching, and the etching rate of the second AlGaInP compound semiconductor layer 12B in this instance is represented by $ER_L$) satisfy the relation:

$ER_U/ER_L=500$.

[Step 140]

Next, a second electrode 15 is formed on the second GaAs layer 12A thus exposed. Specifically, the second electrode 15 is formed by the lift-off method. More specifically, after a vapor deposition mask is formed by a photolithographic technique, layers of Ti layer (100 nm)/Pt layer (100 nm)/Au layer (400 nm) in this order from the active layer side are sequentially formed by use of a vapor deposition apparatus, and thereafter the vapor deposition mask is removed. In this manner, the second electrode (p-side electrode) 15 having a diameter of 3 μm can be obtained (see FIG. 2B).

[Step 150]

Thereafter, with the second electrode (p-side electrode) as an etching mask, the second GaAs layer 12B is subjected to wet etching by use of a mixed solution of phosphoric acid, hydrogen peroxide and water. In this manner, those portions of the second GaAs layer 12B which are not covered with the second electrode 15 can be removed (see FIG. 1A). Incidentally, the second AlGaInP compound semiconductor layer 12B, the active layer 13 and the first AlGaInP compound semiconductor layer 11B are substantially not etched with the mixed solution of phosphoric acid, hydrogen peroxide and water. An etching mask is preliminarily formed over the areas where the first GaAs layer 11A is exposed, by a photolithographic technique, so that the first GaAs layer 11A is not etched.

[Step 160]

Subsequently, a first electrode (n-side electrode) is formed on the first GaAs layer 11A thus exposed. Specifically, after a vapor deposition mask is formed by a photolithographic technique, layers of Pd layer (10 nm)/AuGe alloy layer (85 nm)/Au layer (250 nm) are sequentially formed over the whole area by use of a vapor deposition apparatus, and then the vapor deposition mask is removed. In this manner, a ring-shaped first electrode 14 having a diameter of 10 μm can be obtained. Further, a heat treatment is conducted at 200° C. in nitrogen gas, whereby the first electrode 14 and the first GaAs layer 11A are subjected to a mutual alloying treatment. By the above-mentioned steps, a minute light emitting diode can be formed on the substrate.

Comparative Example 1

For comparison, in a step similar to [Step 100E], an active layer was formed by stopping the supply of the SeH$_2$ gas, whereby a semiconductor light emitting device was obtained. The semiconductor light emitting device thus obtained will be referred to as semiconductor of "Comparative Example 1." In other words, in the semiconductor light emitting device of Comparative Example 1, the active layer is not doped with an n-type impurity.

Comparative Example 2

In addition, by omitting [Step 150], a semiconductor light emitting device was obtained in which the second GaAs layer 12A is left over the whole top surface of the second AlGaInP compound semiconductor layer 12B after the device isolation. The semiconductor light emitting device thus obtained will be referred to as semiconductor light emitting device of "Comparative Example 2."

Comparative Example 3

By forming an active layer by stopping the supply of the SeH$_2$ gas in a step similar to [Step 100E] and by omitting [Step 150], a semiconductor light emitting device was obtained in which the second GaAs layer 12A is left over the whole top surface of the second AlGaInP compound semiconductor layer 12B after the device isolation. The semiconductor light emitting device thus obtained will be referred to as semiconductor light emitting device of "Comparative Example 3."

Figure 6:
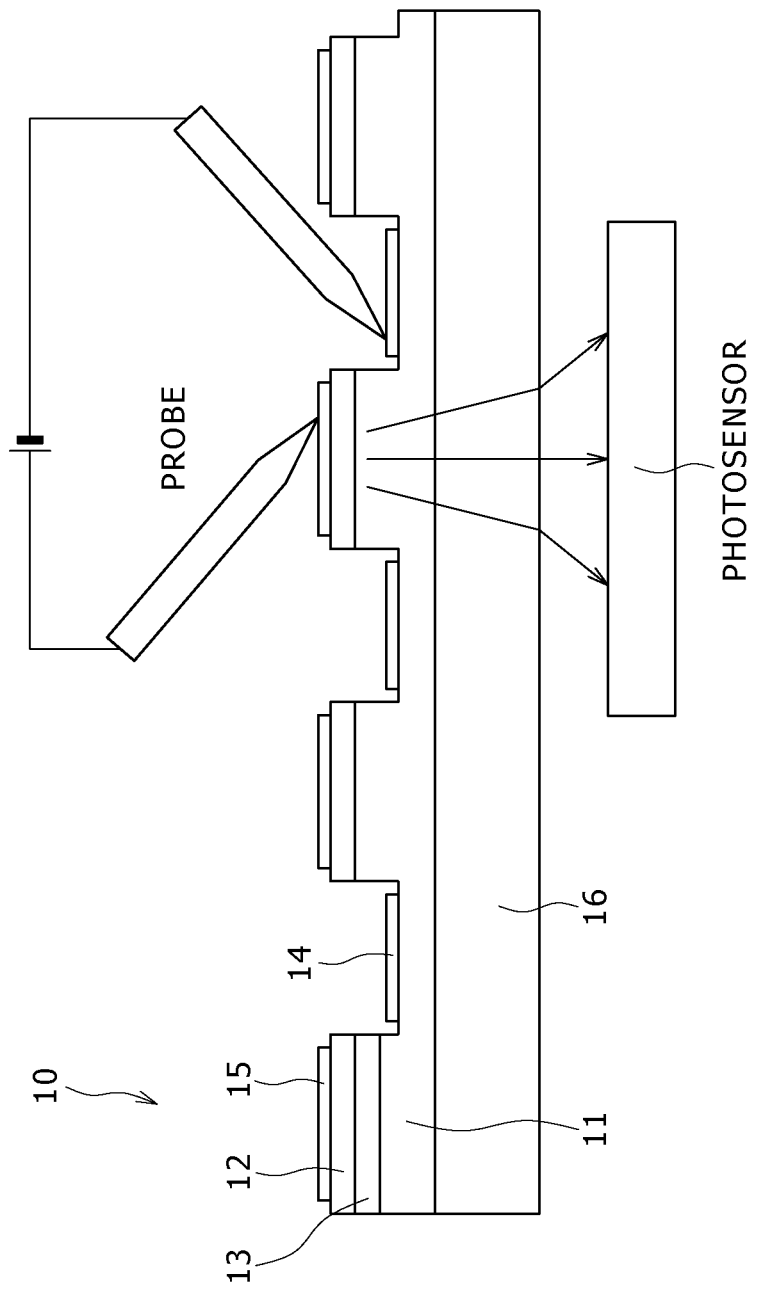

The conditions of Example 1 and Comparative Examples 1, 2 and 3 are summarized in Table 1 below. Incidentally, in evaluating the semiconductor light emitting devices, for simplification, based on the lithographic and etching technologies, the first GaAs layer 11A was exposed, the second electrode 15 was formed on the second GaAs layer 12A, the first electrode 14 was formed on the first GaAs layer 11A, probe needle setting was conducted by use of a prober, and light emitted from the substrate 16 for manufacture of light emitting device was detected. FIG. 6 schematically illustrates the evaluation method.

TABLE 1

| | Doping of active layer with Se | Removal of part of second GaAs layer |
|---|---|---|
| Example 1 | present | present |
| Comparative Example 1 | absent | present |
| Comparative Example 2 | present | absent |
| Comparative Example 3 | absent | absent |

Figure 3:
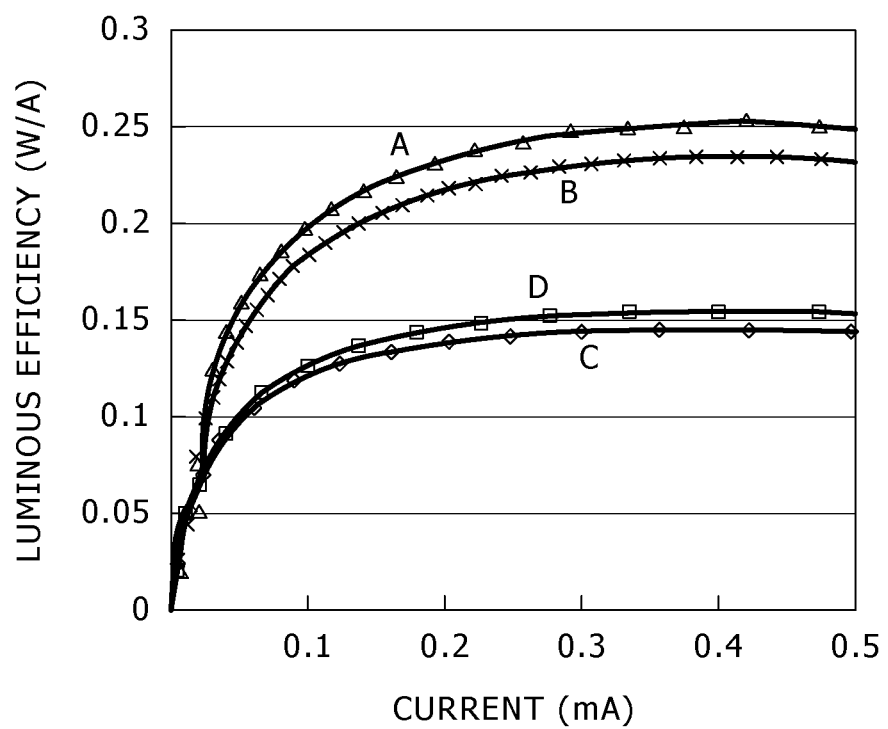
FIG. 3 is a graph showing the measurement results of current-luminous efficiency characteristics of semiconductor light emitting devices according to Example 1 and Comparative Examples 1 to 3.

The measurement results of current-luminous efficiency (watt/ampere) characteristic obtained in Example 1 and Comparative Examples 1 to 3 are shown in FIG. 3. It is seen from FIG. 3 that in Example 1 (indicated by void triangle marks and curve "A," here and in FIGS. 4 and 5 below) and Comparative Example 1 (indicated by marks "x" and curve "B," here and in FIGS. 4 and 5 below), the luminous efficiency was enhanced as compared with Comparative Example 2 (indicated by void rhombic marks and curve "C," here and in FIGS. 4 and 5 below) and Comparative Example 3 (indicated by void square marks and curve "D," here and in FIGS. 4 and 5 below). This is because absorption of light from the active layer into the second GaAs layer is obviated as a result of the partial removal of the second GaAs layer.

Figure 4:
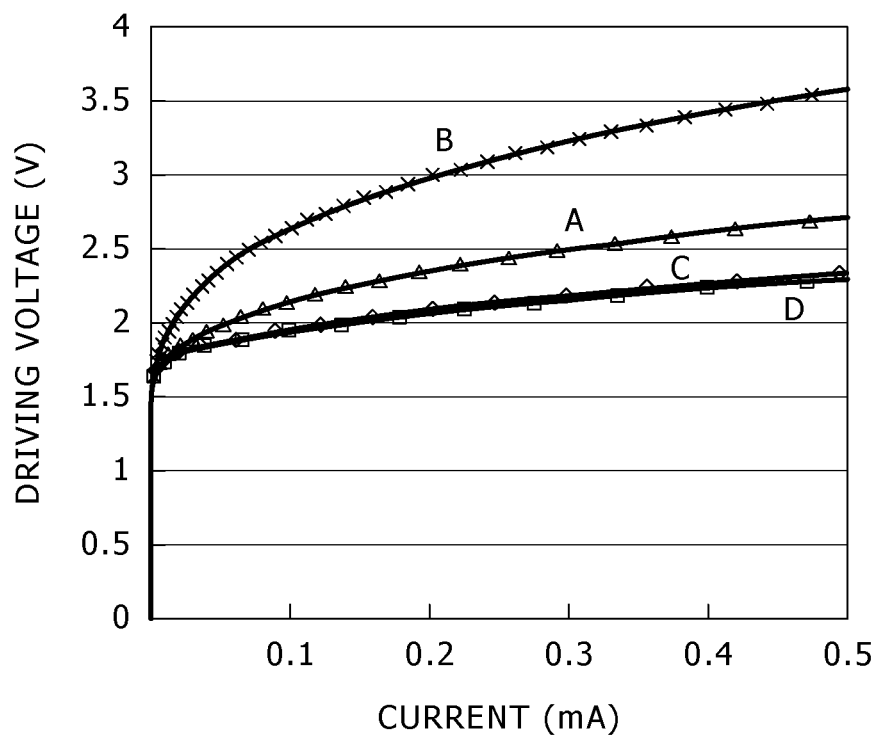
FIG. 4 is a graph showing the measurement results of current-driving voltage characteristics of the semiconductor light emitting devices according to Example 1 and Comparative Examples 1 to 3.

Now, the measurement results of current-driving voltage characteristic obtained in Example 1 and Comparative Examples 1 to 3 are shown in FIG. 4. As seen from FIG. 4, the driving voltage for a given current value was raised in Example 1 and Comparative Example 1 as compared with Comparative Examples 2 and 3. This is considered to be because concentration of current was generated in the semiconductor light emitting device as a result of the partial removal of the second GaAs layer. Comparison between Example 1 and Comparative Example 1 in regard of the driving voltage at a given current value, with special attention paid to the presence or absence of the doping of the active layer with Se, shows that the driving voltage at a given current value was lower in Example 1 in which the doping of the active layer with Se was carried out. In other words, the doping of the active layer with an impurity has a lowering effect on the driving voltage.

Thus, the luminous efficiency can be enhanced by removing those portions of the second GaAs layer 12A which are not located beneath the second electrode 15. Further, doping the active layer 13 with an impurity promises a lowering in the driving voltage.

Figure 5:
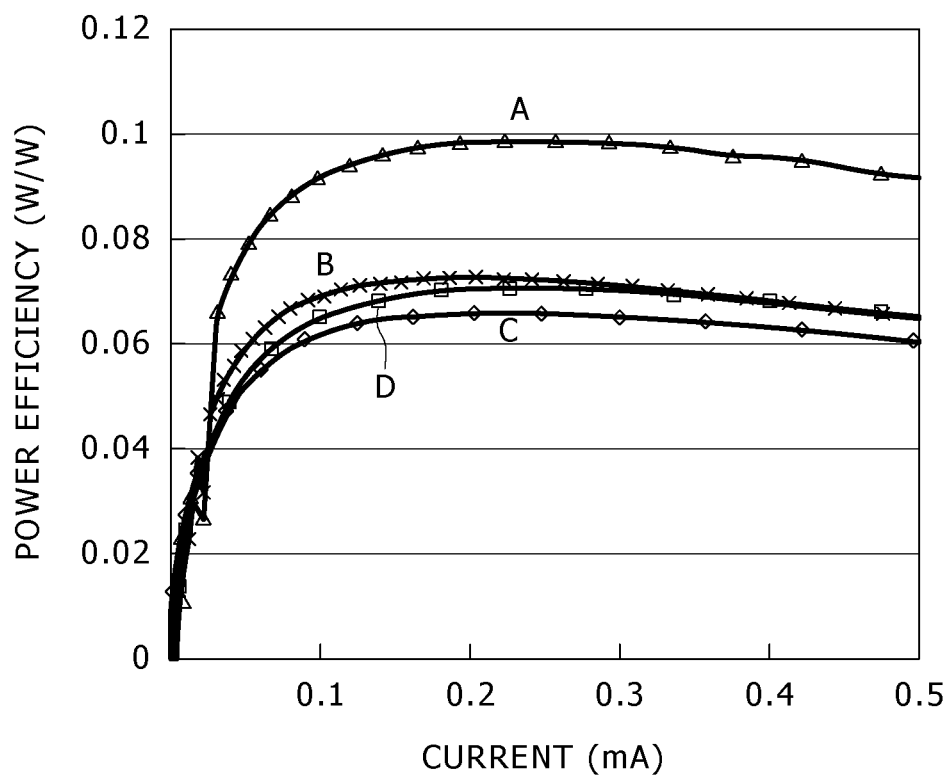
FIG. 5 is a graph showing current-power efficiency characteristics of the semiconductor light emitting devices according to Example 1 and Comparative Examples 1 to 3.

The measurement results of current-power efficiency (watt/watt) obtained in Example 1 and Comparative Examples 1 to 3 are shown in FIG. 5. Incidentally, the power efficiency can be obtained by dividing the luminous efficiency (watt/ampere) shown in FIG. 3 by voltage (volt). It is seen from FIG. 5 that the power efficiency obtained in Example 1 (indicated by curve "A") is higher than those obtained in Comparative Examples 1 to 3 (indicated by curves "B" to "D").

Example 2

Example 2 relates to an image display device and an electronic apparatus according to embodiments of the present invention. The image display device in Example 2 has semiconductor light emitting devices operable to display an image. In addition, the electronic apparatus in Example 2 also has semiconductor light emitting devices. These semiconductor light emitting devices each includes the semiconductor light emitting device as described in Example 1 above.

The image display device or the electronic apparatus in Example 2 includes:

(a) a plurality of first wirings extending in a first direction;

(b) a plurality of second wirings extending in a second direction different from the first direction; and (c) a plurality of semiconductor light emitting devices each of which has a first electrode 14 electrically connected to the first wiring and a second electrode 15 electrically connected to the second wiring.

The image display device in Example 2, more specifically, includes a light emitting diode display device. Here, one pixel in the light emitting diode display device has a set (light emitting unit) of a first light emitting diode 110, a second light emitting diode 210 and a third light emitting diode 310. Incidentally, for example, the first light emitting diodes 110, of the first, second and third light emitting diodes 110, 210 and 310, has the semiconductor light emitting device described in Example 1 above. A plurality of the light emitting units are arranged in a first direction and in a second direction orthogonal to the first direction, in the pattern of a two-dimensional matrix. In addition, the first electrode 114 of the first light emitting diode 110, the first electrode 214 of the second light emitting diode 210 and the first electrode 314 of the third light emitting diode 310, in each light emitting unit, are connected to a first connection part (hereinafter, this first connection part may be referred to as "sub common electrode 43"). On the other hand, a lead-out electrode 116 provided in the first light emitting diode 110 in each of the light emitting units arranged in the second direction is connected to the second wiring extending in the second direction (hereinafter, this second wiring will be referred to as "first common electrode" or "first common wiring" 401). Besides, a lead-out electrode 216 provided in the second light emitting diode 210 is connected to the second wiring extending in the second direction (hereinafter, this second wiring will be referred to as "second common electrode" or "second common wiring" 402). Further, a lead-out electrode 316 provided in the third light emitting diode 310 is connected to the second wiring extending in the second direction (hereinafter, this second wiring will be referred to as "third common electrode" or "third common wiring" 403). Incidentally, the sub common electrode 43 in the light emitting units arranged in the second direction is connected to the first wiring extending in the first direction (hereinafter, this first wiring will be referred to as "fourth common electrode" or "fourth common wiring" 404).

Let a desired number of the first light emitting diodes constituting the light emitting unit be $N_1$, let a desired number of the second light emitting diodes constituting the light emitting unit be $N_2$, and let a desired number of the third light emitting diodes constituting the light emitting unit be $N_3$, then $N_1$ may be 1 or an integer of not less than 2, $N_2$ may be 1 or an integer of not less than 2, and $N_3$ may be 1 or an integer of not less than 2. The values of $N_1$ and $N_2$ and $N_3$ may be equal or different. In the case where the values of $N_1$ and $N_2$ and $N_3$ are integers of not less than 2, the light emitting diodes in one light emitting unit may be connected in series or connected in parallel. The combination of the values of $(N_1, N_2, N_3)$ is not particularly limited, and examples of the combination include (1, 1, 1), (1, 2, 1), (2, 2, 2), and (2, 4, 2). Incidentally, in Example 2, the combination of the values of $(N_1, N_2, N_3)$ specifically was set to be (1, 1, 1). The light emitting diode display device or electronic apparatus in Example 2 has a configuration wherein a plurality of the light emitting units each of which has the desired number of the first light emitting diode(s) 110 operable to emit red light, the desired number of the second light emitting diode(s) 210 operable to emit green light and the desired number of the third light emitting diode(s) 310 operable to emit blue light are arranged in a first direction and in a second direction orthogonal to the first direction, in the pattern of a two-dimensional matrix.

Figure 7:
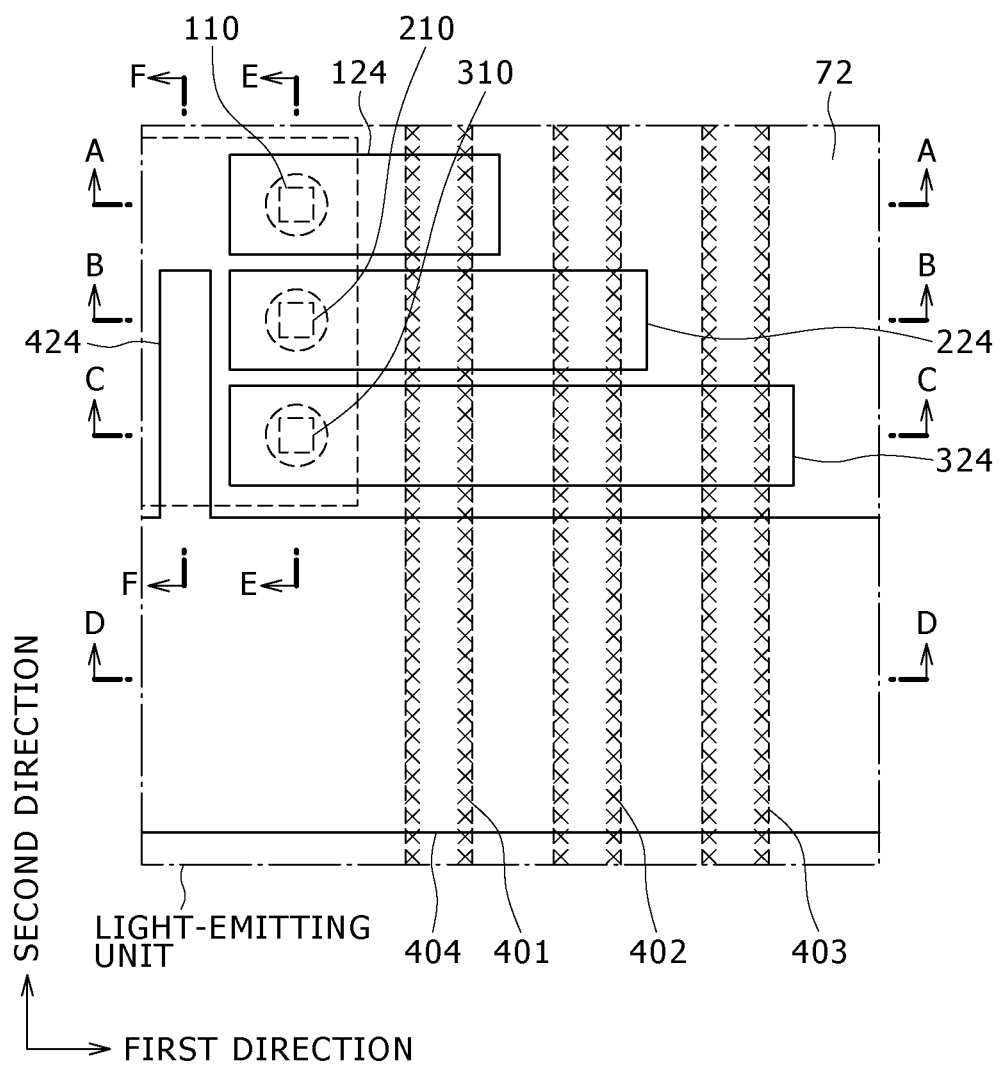
FIG. 7 is a schematic plan view of one light emitting unit in a light emitting diode display device according to Example 2 of the present invention.
Figure 9A:
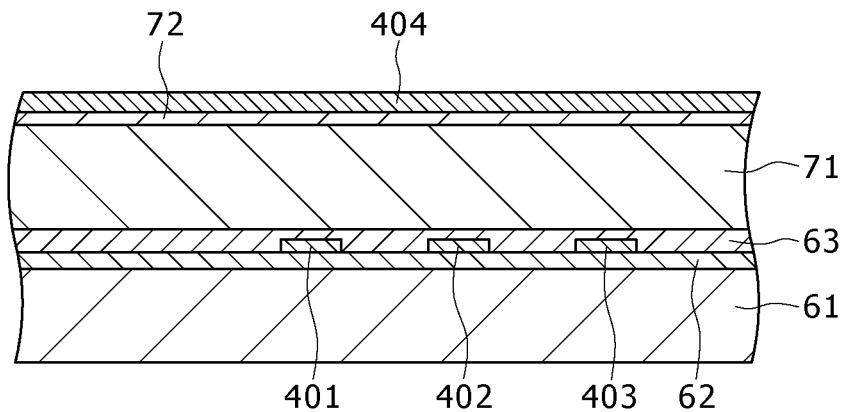
FIGS. 9A, 9B and 9C are schematic partial sectional views respectively taken along arrow D-D, arrow E-E and arrow F-F of FIG. 7, of one light emitting unit in the light emitting diode display device according to Example 2.
Figure 9B:
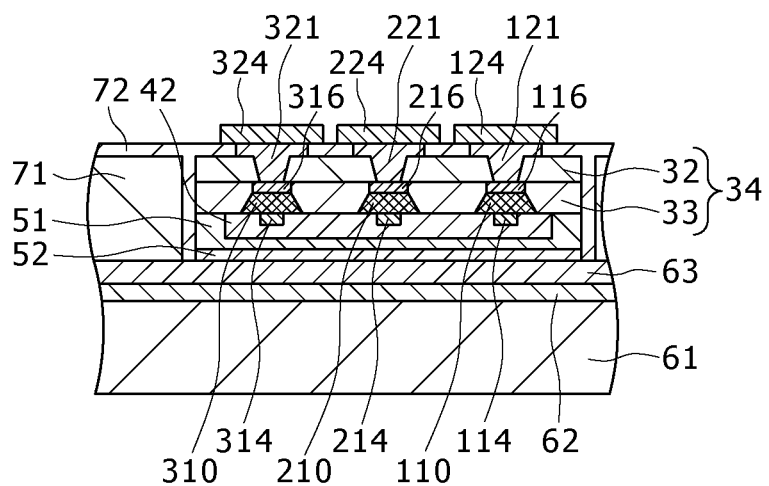
Figure 9C:
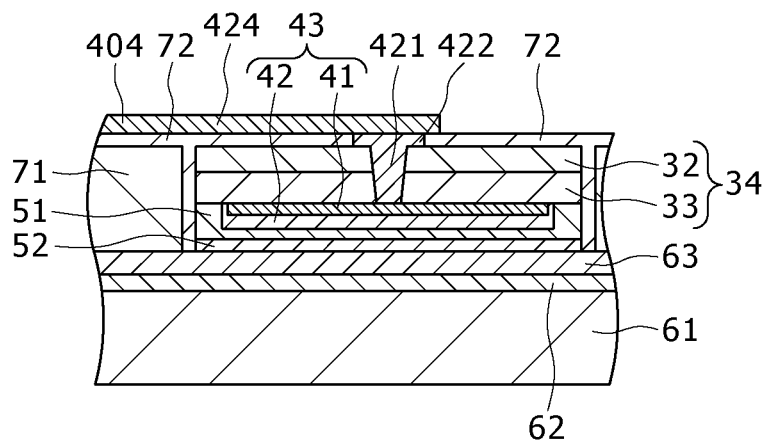

A schematic plan view of one light emitting unit is shown in FIG. 7, and schematic partial sectional views taken along arrow A-A, arrow B-B, arrow C-C, arrow D-D, arrow E-E, and arrow F-F of FIG. 7 are shown in FIGS. 8A, 8B, 8C, 9A, 9B, and 9C, respectively. Incidentally, in FIG. 7, the one light emitting unit is surrounded by a dash-dot line; the light emitting diodes are indicated by broken lines; edge portions of the three second wirings (the first common electrode 401, the second common electrode 402, and the third common electrode 403) are cross-hatched; and edge portions of the second connection parts (the second-A connection part 124, the second-B connection part 224, and the second-C connection part 324), the third connection part 424 and the first wiring (the fourth common electrode 404) are indicated by solid lines.

Here, the first common electrode 401, the second common electrode 402 and the third common electrode 403 are formed on the display device substrate 61, and the sub common electrode 43 is formed on a fixation layer 34 which is fixed on the display device substrate 61. Further, the first light emitting diode 110, the second light emitting diode 210 and the third light emitting diode 310 in the light emitting unit are fixed to the fixation layer 34, and the fixation layer 34 is surrounded by a second insulating material layer 71. Here, the second insulating material layer 71 is covering the first common electrode 401, the second common electrode 402 and the third common electrode 403 which are formed on the display device substrate 61.

In the light emitting diode display device or electronic apparatus in Example 2, the lights from the first light emitting diode 110, the second light emitting diode 210 and the third light emitting diode 310 are emitted via the first electrode side. In addition, the sub common electrode 43 has a light-transmitting structure. The sub common electrode 43 may be composed of a metallic layer or an alloy layer. Or, alternatively, the sub common electrode 43 has a light-transmitting electrode 42 and a metallic layer 41 extending from the light-transmitting electrode 42. Besides, the first light emitting diode 110, the second light emitting diode 210 and the third light emitting diode 310 in the light emitting unit are arranged on the sub common electrode 43 in the condition where their first electrodes 114, 214 and 314 are connected to the sub common electrode 43. Specifically, the respective first electrodes 114, 214 and 314 of the first light emitting diode 110, the second light emitting diode 210 and the third light emitting diode 310 are in contact with the light-transmitting electrode 42. More specifically, the light-transmitting electrode 42 is formed on the first electrodes 114, 214, 314 and in the peripheries of the first electrodes 114, 214, 314. On the other hand, a fourth contact hole part 421 is in contact with the metallic layer 41. Specifically, the fourth contact hole part 421 is formed on the metallic layer 41. Here, the light-transmitting electrode 42 is formed by use of a transparent conductive material such as ITO and IZO. On the other hand, the metallic layer 41 was formed by use of a general metallic wiring material such as, for example, Au, Cu or Al.

While the sub common electrode 43 may be composed, for example, of a metallic layer or alloy layer, the sub common electrode 43 may specifically be composed of a mesh form electrode or a comb-shaped electrode. Or, alternatively, the sub common electrode 43 may be composed, for example, of a light-transmitting electrode and a metallic layer or alloy layer extending from the light-transmitting electrode. In this case, specifically, the light-transmitting electrode may be formed by use of a transparent conductive material such as ITO, IZO, etc., or the light-transmitting electrode may be composed of a mesh form electrode or a comb-shaped electrode. Incidentally, the mesh form electrode or comb-shaped electrode itself may not necessarily be light-transmitting, insofar as the electrode has a light-transmitting structure. In addition, examples of the material constituting the metallic layer or alloy layer include elemental metals such as Ti, Cr, Ni, Au, Ag, Cu, Pt, W, Ta, Al, etc. and alloys thereof. Besides, the sub common electrode 43 may have a multilayer structure composed of two or more layers. While the respective first electrodes of the first light emitting diode, the second light emitting diode and the third light emitting diode are each in contact with the light-transmitting electrode, the light-transmitting electrode may specifically be formed on the first electrode or be formed on the first electrode and in the periphery of the first electrode. In addition, while the fourth contact hole part is preferably in contact with the metallic layer or alloy layer, the fourth contact hole part may specifically be formed on the metallic layer or alloy layer.

The lead-out electrode 116 provided in the first light emitting diode 110 is connected to the first common electrode 401 via a first contact hole part 121 formed in the fixation layer 34 and a second connection part (the second-A connection part 124 and a contact part 123) formed to range from the upper side of the fixation layer 34 to the second insulating material layer 71. The lead-out electrode 216 provided in the second light emitting diode 210 is connected to the second common electrode 402 via a second contact hole part 221 formed in the fixation layer 34 and a second connection part (the second-B connection part 224 and a contact part 223) formed to range from the upper side of the fixation layer 34 to the second insulating material layer 71. The lead-out electrode 316 provided in the third light emitting diode 310 is connected to the third common electrode 403 via a third contact hole part 321 formed in the fixation layer 34 and a second connection part (the second-C connection part 324 and a contact part 323) formed to range from the upper side of the fixation layer 34 to the second insulating material layer 71. The first connection part (the sub common electrode 43) is connected to the first wiring (the fourth common electrode 404) formed on the second insulating material layer 71, via a fourth contact hole part 421 formed in the fixation layer 34 and a third connection part 424 formed to range from the upper side of the fixation layer 34 to the upper side of the second insulating material layer 71. Incidentally, in Example 2, a first pad part 122 formed in the fixation layer 34 is provided between the first contact hole part 121 and the second-A connection part 124. A second pad part 222 formed in the fixation layer 34 is provided between the second contact hole part 221 and the second-B connection part 224. A third pad part 322 formed in the fixation layer 34 is provided between the third contact hole part 321 and the second-C connection part 324. A fourth pad part 422 formed in the fixation layer 34 is provided between the fourth contact hole part 421 and the third connection part 424.

Examples of the material which can be used to form the lead-out electrodes 116, 216, 316 include the above-mentioned various materials for forming the first and second wirings. Examples of the method for forming the lead-out electrodes 116, 216, 316 include various PVD methods. In addition, by appropriately selecting the forming method, it is also possible to directly form the patterned lead-out electrodes.

The first contact hole part 121, the second contact hole part 221, the third contact hole part 321 and the fourth contact hole part 421 are each formed by use of a wiring material such as Al, Cu, etc. Also, the first pad part 122, the second pad part 222, the third pad part 322 and the fourth pad part 422 are each formed by use of a wiring material such as Al, Cu, etc. Further, the second-A connection part 124, the second-B connection part 224, the second-C connection part 324, and the third connection part 424 are each formed by use of a wiring material such as Al, Cu, etc.

The first contact hole part 121, the second contact hole part 221, the third contact hole part 321 and the fourth contact hole part 421 can be formed by a method of forming opening regions in the fixation layer 34 which is based on the lithographic technique and a method similar to the above-mentioned method of forming the electrodes which is based on the electrode material. In addition, the method for forming the first pad part 122 extending from the first contact hole part 121 and over the fixation layer 34, the method for forming the second pad part 222 extending from the second contact hole part 221 and over the fixation layer 34, the method for forming the third pad part 322 extending from the third contact hole part 321 and over the fixation layer 34, and the method for forming the fourth pad part 422 extending from the fourth contact hole part 421 and over the fixation layer 34 may, specifically, be appropriately selected from the above-mentioned methods for forming the common electrodes and the like. Further, the method for forming the second connection parts (the second-A connection part 124, the contact part 123, the second-B connection part 224, the contact part 223, the second-C connection part 324, the contact part 323) in the range from the fixation layer 34 to the second insulating material layer 71 and the method for forming the third connection part 424 in the range from the fixation layer 34 to the second insulating material layer 71 may, specifically, be appropriately selected from the above-mentioned methods for forming the common electrodes and the like.

While the first compound semiconductor layer 11 is electrically connected to the first electrodes 114, 214, 314, specifically, the first electrodes 114, 214, 314 are formed on the first compound semiconductor layer 11 (more specifically, on the first GaAs layer 11A). The second electrode is formed on the second compound semiconductor layer 12 (more specifically, on the second GaAs layer 12A). In addition, the first common electrode 401, the second common electrode 402, the third common electrode 403, and the fourth common electrode 404 are formed by use of a wiring material such as Al, Cu, etc. The fixation layer 34 has, for example, a two-layer structure composed of an insulating material layer 32 and a burying material layer 33 in this order from the side of a first transfer substrate. The insulating material layer 32 has a polyimide resin, and the burying material layer 33 has a UV-curing resin. In addition, the second insulating material layer 71 has a polyimide resin. Examples of the method for fixing the first light emitting diode 110, the second light emitting diode 210 and the third light emitting diode 310 to the fixation layer 34 include a method in which part of the burying material layer 33 is preliminarily cured, whereas the remaining parts of the burying material layer 33 are left uncured, and, in this condition, the first light emitting diode 110, the second light emitting diode 210 and the third light emitting diode 310 are burying in the uncured parts of the burying material layer 33, followed by curing the uncured parts of the burying material layer 33.

The burying material layer 33 may basically be composed of any material that can be cured or solidified based on some method, such as a material which can be cured or solidified by irradiation with energy radiations such as light (particularly, UV rays, etc.), radioactive rays (X-rays, etc.), electron beams, etc., a material which can be cured or solidified by application of heat, pressure or the like, and so on. Specific examples of this material include various materials which will be mentioned in the description of an adhesive for forming the adhesive layer (second insulating layer).

Now, the method of manufacturing the light emitting diode display device or electronic apparatus in Example 2 will be described below, referring to FIGS. 12A to 12C, FIGS. 13A and 13B, FIGS. 14A and 14B, FIGS. 15A to 15C, FIGS. 16A to 16C, FIGS. 17A to 17C, FIGS. 18A to 18C, FIGS. 19A to 19C, FIGS. 20A to 20C, FIGS. 21A to 21C, FIGS. 22A to 22C, FIGS. 23A to 23C, and FIGS. 24A to 24C. Incidentally, FIGS. 15A, 16A, 17A, 18A, 19A, 20A, 21A, 22A, 23A and 24A are schematic partial end views equivalent to those taken along arrow B-B of FIG. 7; FIGS. 15B, 16B, 17B, 18B, 19B, 20B, 21B, 22B, 23B and 24B are schematic partial end views equivalent to those taken along arrow E-E of FIG. 7; and FIGS. 15C, 16C, 17C, 18C, 19C, 20C, 21C, 22C, 23C and 24C are schematic partial end views equivalent to those taken along arrow F-F of FIG. 7.

[Step 200]

Figure 10A:
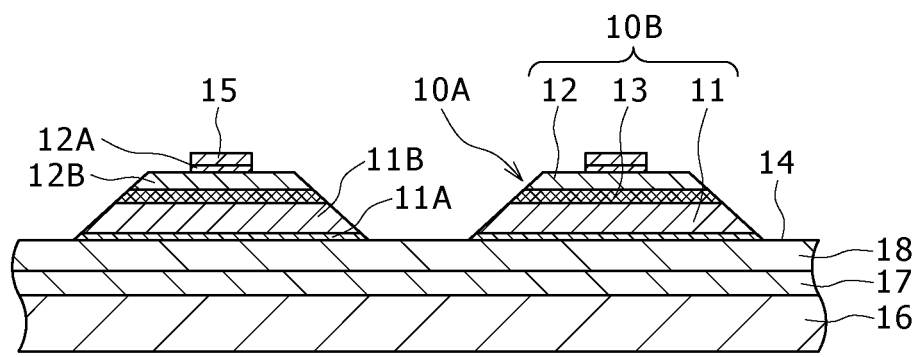
FIGS. 10A, 10B and 10C are schematic partial end views of a light emitting diode and the like for illustrating the method of manufacturing the light emitting diode display device according to Example 2.

Specifically, first, steps similar to [Step 100] to [Step 150] in Example 1 are carried out, whereby the second electrode 15 is formed, and a plurality of light emitting device parts 10A mutually isolated are obtained (see FIG. 10A).

Figure 10B:
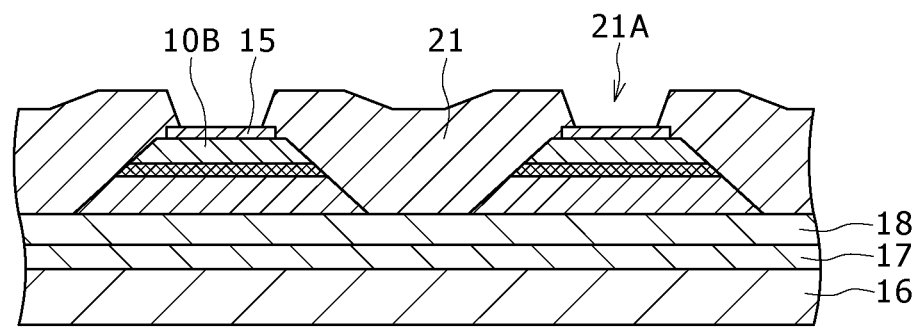

Thereafter, an insulating layer 21 having openings 21A where a central portion of the top surface of the second electrode 15 of each light emitting device part 10A is exposed is formed over the whole surface. Specifically, a photosensitive polyimide resin is applied to the whole surface, based on a spin coating method. Thereafter, by use of a mask which is not shown in the drawings, exposure of the photosensitive polyimide resin to light is conducted. Further, the photosensitive polyimide resin is subjected to development and curing. In this manner, the insulating layer 21 having the openings 21A where the central portion of the top surface of the second electrode 15 of each light emitting device part 10A is exposed can be obtained (see FIG. 10B).

Other than the above-mentioned, examples of the material for forming the insulating layer include inorganic insulating materials such as silicon oxide materials, silicon nitride ($SiN_Y$) and metal oxide high-dielectric-constant insulating film, and organic insulating materials such as polymethyl methacrylate (PMMA), polyvinyl phenol (PVP) and polyvinyl alcohol (PVA) or a combination of them. Besides, other photosensitive insulating materials (e.g., polyamide resin) can also be used. Incidentally, examples of the silicon oxide materials include silicon oxide ($SiO_X$), silicon oxynitride (SiON), SOG (spin-on-glass), and low-dielectric-constant $SiO_X$ materials. Other examples of the organic insulating materials than the above-mentioned include polyaryl ethers, cycloperfluorocarbon polymers, benzocyclobutene, cyclic fluororesin, polytetrafluoroethylene, fluorinated aryl ethers, fluorinated polyimides, amorphous carbon, and organic SOG. Other examples of the method for forming the insulating layer than the spin coating method include various PVD methods, various CVD methods, the above-mentioned various printing methods, the above-mentioned various coating methods, a dipping method, a casting method, and a spraying method.

Figure 10C:
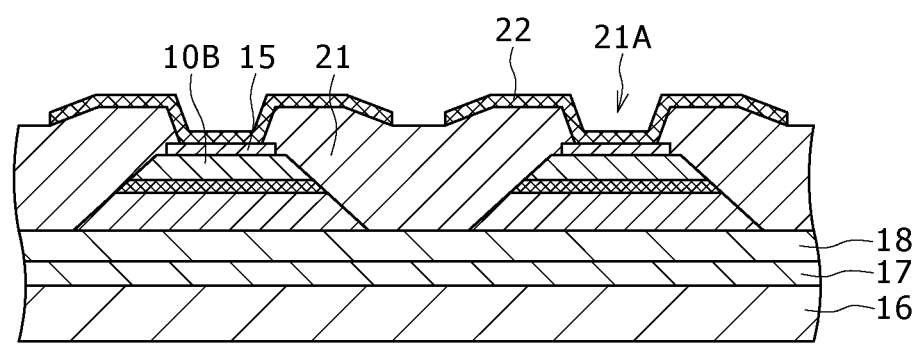

Next, each light emitting device part 10A is provided with a lead-out electrode 22 which is patterned in the range from the upper side of the top surface of the second electrode 15 exposed at a bottom portion of the opening 21A to the upper side of the insulating layer 21 (see FIG. 10C). Specifically, based on a physical vapor deposition method (PVD method) such as a sputtering method, a lead-out electrode layer having a stacked structure of titanium layer (lower layer)/copper layer (upper layer) is formed in the range from the upper side of the top surface of the second electrode 15 exposed at the bottom portion of each opening 21A to the upper side of the insulating layer 21, and thereafter the lead-out electrode layer is patterned by a known method, whereby the lead-out electrode 22 can be obtained.

Figure 11A:
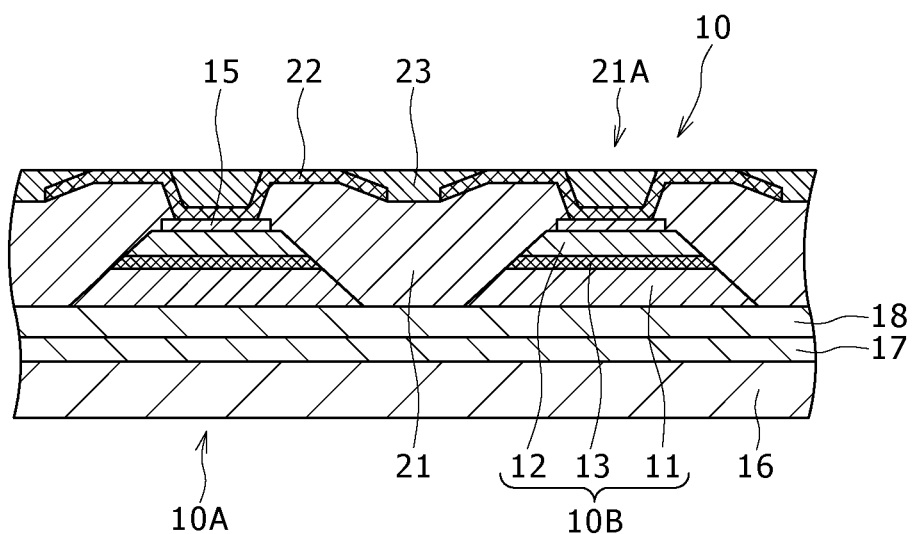
FIGS. 11A and 11B are schematic partial end views of a light emitting diode and the like for illustrating, in succession to FIG. 10C, the method of manufacturing the light emitting diode display device according to Example 2.

Subsequently, after the adhesive layer (second insulating layer) 23 covering the whole surface is formed, and a support substrate 24 is adhered by use of the adhesive layer (second insulating layer) 23. Specifically, first, the adhesive layer 23 allowing the lead-out electrodes 22 to be partly exposed is formed on the lead-out electrodes 22 (see FIG. 11A). More specifically, the adhesive layer 23 having an epoxy thermosetting resin is formed on the whole surface, based on a spin coating method, and the adhesive layer 23 is dried. By regulation of physical properties such as viscosity of the adhesive layer 23, optimization of spin coating conditions and the like, the adhesive layer 23 permitting the lead-out electrodes 22 to be partly exposed can be formed over the lead-out electrodes 22. Thereafter, using a hot press, the support substrate 24 is adhered by the adhesive layer 23 (see FIG. 11B).

The adhesive constituting the adhesive layer (second insulating layer) 23 may basically be composed of any material that exhibits an adhesive function based on some method, such as materials which exhibit an adhesive function when irradiated with energy radiations such as light (particularly, UV rays, etc.), radioactive rays (X-rays, etc.), electron beams, etc. or when heat, pressure or the like is applied thereto. Here, examples of a material which can be easily formed and which exhibits an adhesive function include resin-based adhesive materials, particularly, photosensitive adhesives, thermosetting adhesives, and thermoplastic adhesives. As the photosensitive adhesive, those which have been known can be used. Specific examples of the known photosensitive adhesives include negative-type ones such that exposed portions undergo a photo-crosslinking reaction to be difficultly soluble, such as polyvinyl cinnamate, polyvinyl azide benzal, etc. or such that exposed portions undergo a photopolymerization reaction to be difficultly soluble, such as acrylamide, etc.; and positive-type ones such that exposed portions become easily soluble, through formation of carboxylic acid due to photodecomposition of quinone diazide groups, such as o-quinone diazide novolak resin. As the thermosetting adhesive, those which have been known can be used, specific examples thereof including epoxy resin, phenolic resin, urea resin, melamine resin, unsaturated polyester resin, polyurethane resin, polyimide resin, etc. As the thermoplastic adhesive, those which have been known can be used, specific examples thereof including polyethylene resin, polystyrene resin, polyvinyl chloride resin, polyamide resin, etc. For instance, in the case where a photosensitive adhesive is used, the photosensitive adhesive may be irradiated with light or UV rays, whereby the adhesive can be caused to exhibit an adhesive function. Besides, where the thermosetting adhesive is used, the thermosetting adhesive may be heated by use of a hot press or the like, whereby the adhesive can be made to exhibit an adhesive function. Further, where a thermoplastic adhesive is used, a part of the thermoplastic adhesive may be selectively heated by irradiation with light or the like so that the part is melted and becomes fluid, followed by cooling, whereby the adhesive can be caused to exhibit an adhesive function. Other examples of the material constituting the adhesive layer or adhesive than the above-mentioned include pressure-sensitive adhesives (composed, for example, of an acrylic resin or the like), and those which have an adhesive function directly upon being formed.

(Step 210)

Thereafter, the first light emitting diode(s) 110, the second light emitting diode(s) 210 and the third light emitting diode(s) 310 are tentatively fixed to a substrate 53 for manufacture of light emitting unit, to obtain a light emitting unit which includes a desired number of the first light emitting diode(s) 110, a desired number of the second light emitting diode(s) 210 and a desired number of the third light emitting diode(s) 310 and in which the respective first electrodes 114, 214, 314 of the first light emitting diode(s) 110, the second light emitting diode(s) 210 and the third light emitting diode(s) 310 are connected to the sub common electrode 43.

[Step 210A]

Specifically, the first light emitting diode(s) 110 on a first support substrate is transferred onto the fixation layer 34, the second light emitting diode(s) 210 on a second support substrate is transferred onto the fixation layer 34, and the third light emitting diode(s) 310 on a third support substrate is transferred onto the fixation layer 34. Incidentally, the order of these transferring operations is intrinsically arbitrary.

Therefore, a first transfer substrate 31 provided with the fixation layer 34 is prepared in advance. As above-mentioned, the fixation layer 34 has a two-layer structure composed of the insulating material layer 32 and the burying material layer 33 in this order from the first transfer substrate side. The insulating material layer 32 is formed by use of a polyimide resin, and the burying material layer 33 is formed by use of a photosensitive resin. Incidentally, of the burying material layer 33, those portions where to bury the first light emitting diodes 110, the second light emitting diodes 210 and the third light emitting diodes 310 are kept uncured, whereas the other portions are cured in advance.

Examples of the material constituting the support substrates and other various substrates to be used in the various manufacturing steps include glass plates, metallic plates, alloy plates, ceramic plates, plastic plates, in addition to the above-mentioned materials constituting the substrate for manufacture of light emitting device. Besides, examples of the method for mutually adhering the various substrates or fixing them include methods in which an adhesive material is used, metal bonding methods, semiconductor bonding methods, metal-semiconductor bonding methods, etc. On the other hand, examples of the method for peeling various substrates or removing them include laser ablation methods, heating methods, etching methods, etc. In addition, examples of the method for separating the semiconductor light emitting devices or light emitting device parts from the support substrate or the like include laser irradiation methods, dry etching methods, wet etching methods, and dicing methods.

[Step 210A-(1)]

Figure 11B:
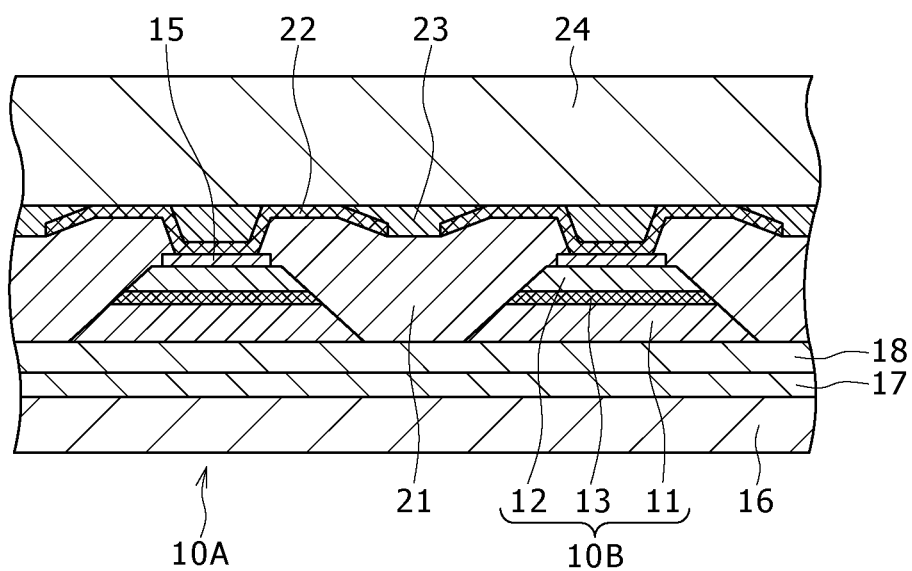
Figure 12A:
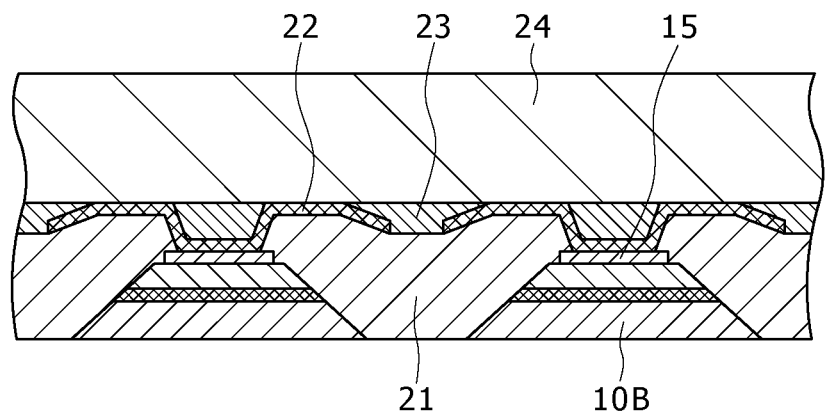
FIGS. 12A, 12B and 12C are schematic partial end views of a light emitting diode and the like for illustrating, in succession to FIG. 11B, the method of manufacturing the light emitting diode display device according to Example 2.
Figure 12B:
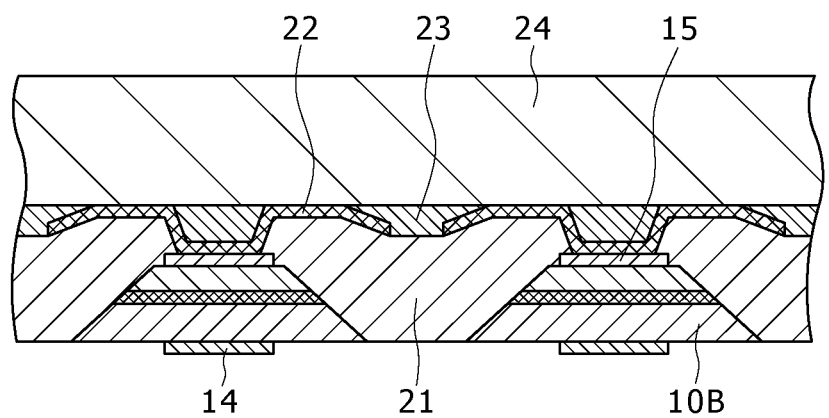
Figure 12C:
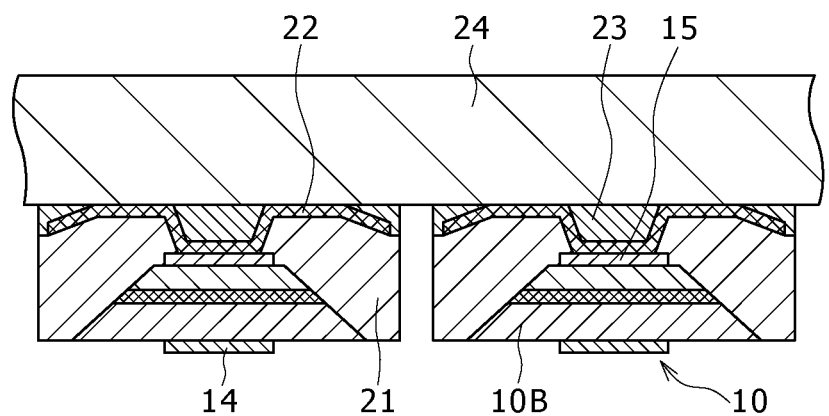
Figure 13A:
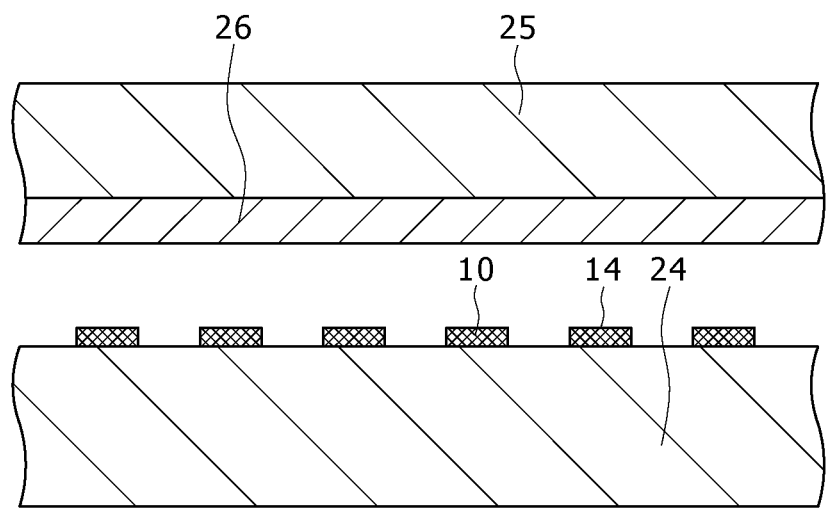
FIGS. 13A and 13B are schematic partial end views of a light emitting diode and the like for illustrating, in succession to FIG. 12C, the method of manufacturing the light emitting diode display device according to Example 2.
Figure 13B:
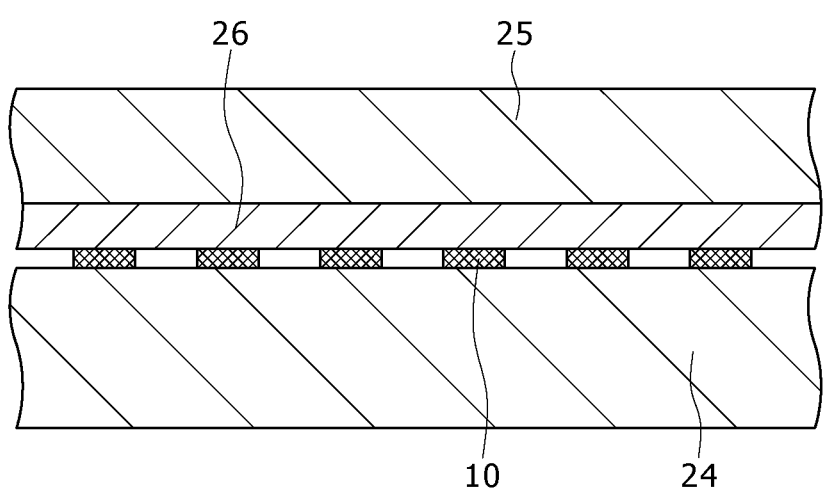
Figure 14A:
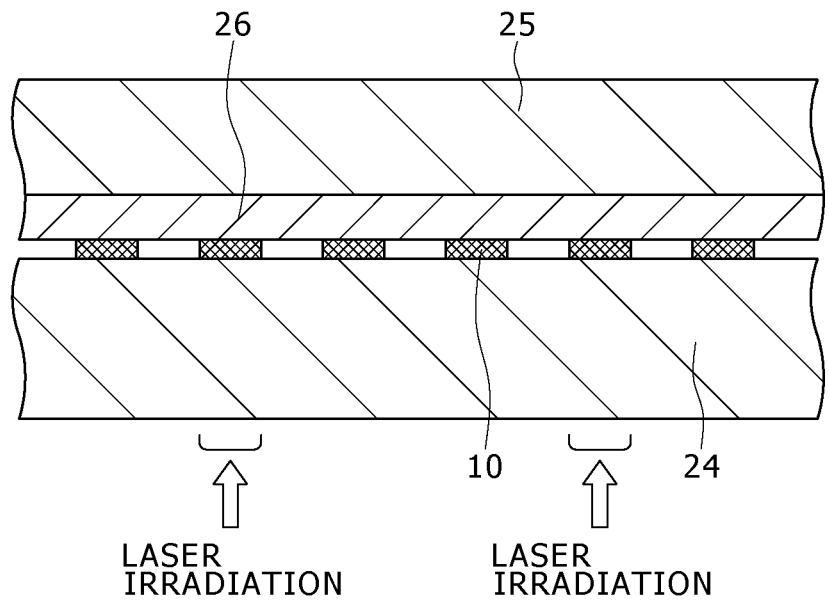
FIGS. 14A and 14B are schematic partial end views of a light emitting diode and the like for illustrating, in succession to FIG. 13B, the method of manufacturing the light emitting diode display device according to Example 2.
Figure 14B:
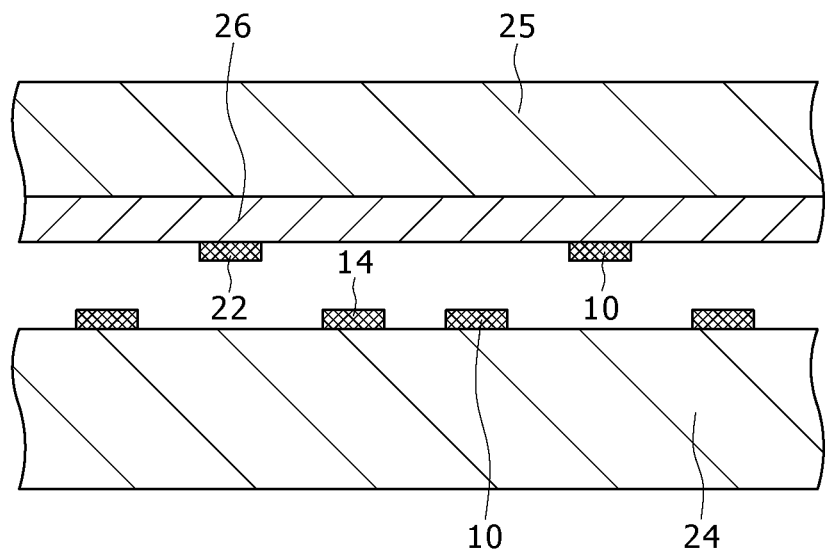
Figure 15A:
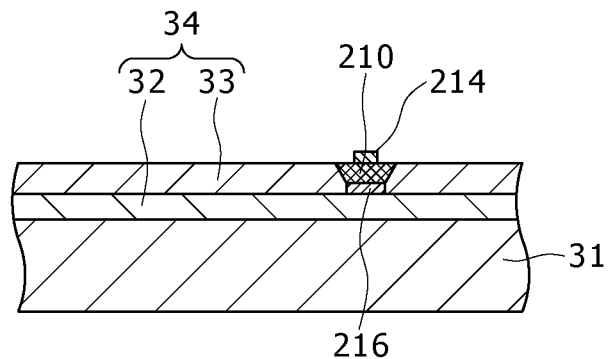
FIGS. 15A, 15B and 15C are schematic partial end views, equivalent to those respectively taken along arrow B-B, arrow E-E and arrow F-F of FIG. 7, for illustrating the method of manufacturing the light emitting diode display device according to Example 2.
Figure 15B:
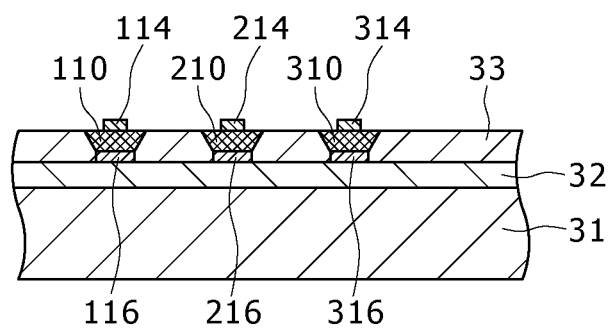
Figure 15C:
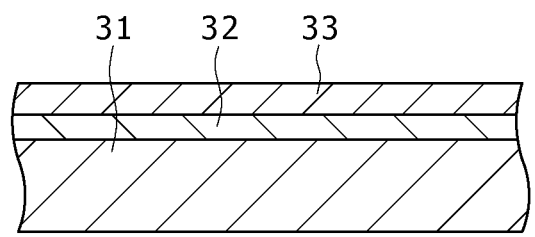

First, as above-mentioned, the substrate 16 for manufacture of light emitting device is adhered to the support substrate (tentative fixing substrate) 24 so that the lead-out electrodes 22 make contact with the support substrate 24 (see FIG. 11B). Next, the substrate 16 for manufacture of light emitting device is removed from the light emitting diodes 10 (110, 210, 310). Thereafter, the first electrodes 14 (114, 214, 314) are formed on the exposed first compound semiconductor layer 11. Specifically, the interface between the light emitting diodes 10 (110, 210, 310) (more specifically, the first compound semiconductor layer 11) and the substrate 16 for manufacture of light emitting diode is irradiated with excimer laser beams through the substrate 16. By this, laser ablation is effected and, as a result, the substrate 16 for manufacture of light emitting diode becomes able to be peeled from the light emitting diodes 10 (110, 210, 310) (see FIG. 12A). Incidentally, the substrate 16 for manufacture of light emitting device may be removed by a method in which the substrate 16 is thinned by lapping from the back side thereof, and, further, the substrate 16 is etched with a mixed solution of aqueous ammonia and aqueous hydrogen peroxide solution. Furthermore, etching with a mixed solution of aqueous ammonia and aqueous hydrogen peroxide solution is conducted to remove a buffer layer 17, and etching with hydrochloric acid is conducted to remove the etching stop layer 18, thereby exposing the first compound semiconductor layer 11 (more specifically, the first GaAs layer 11A). Next, the first electrodes 14 (114, 214, 314) are formed on the first compound semiconductor layer 11 (more specifically, on the first GaAs layer 11A) by a lift-off method and a vacuum evaporation method, in substantially the same manner as in [Step 160] of Example 1. In this manner, a structure as shown in FIG. 12B can be obtained. Thereafter, etching is conducted to isolate the light emitting diodes 10. In this way, a structure as shown in FIG. 12C can be obtained.

[Step 210A-(2)]

Figure 31A:
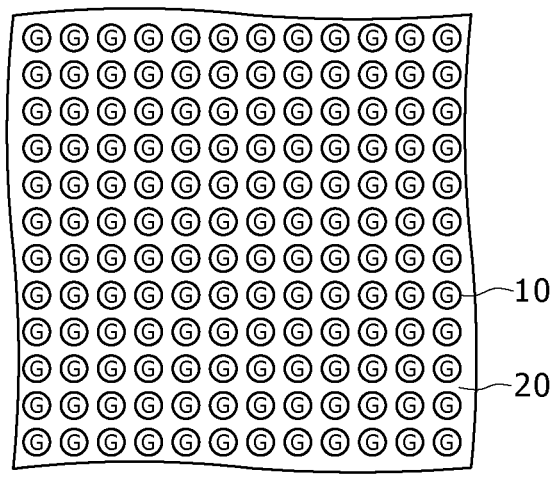
FIGS. 31A and 31B are schematic partial plan views for illustrating the method of manufacturing the light emitting diode display device according to Example 2.
Figure 31B:
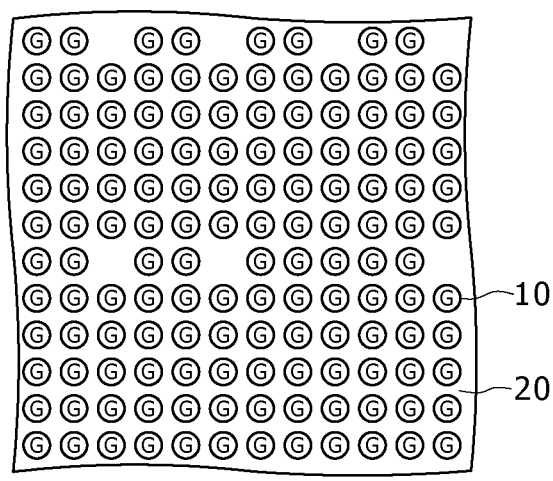

Next, the desired light emitting diodes 10 (110, 210, 310) are transferred from the support substrate 24 onto a relay substrate 25. Specifically, the light emitting diodes 10 (110, 210, 310) adhered to the support substrate 24 are adhered to the relay substrate 25. More specifically, first, as schematically shown in FIG. 31A, a slightly tacky layer 26 formed on a surface of the relay substrate 25 having a glass plate is pressed against the light emitting diodes 10 (110, 210, 310) on the support substrate 24 on which the light emitting diodes 10 are left in the pattern of an array (two-dimensional matrix) (see FIGS. 13A and 13B). Incidentally, in FIGS. 31A, 31B, 32A and 32B, the circle marks with "G" in the center thereof denote the second light emitting diodes 210 emitting green light; in FIG. 32B, the circle marks with "R" in the center thereof denote the first light emitting diodes 110 emitting red light, and the circle marks with "B" in the center thereof denote the third light emitting diodes 310 emitting blue light. The slightly tacky layer 26 is composed, for example, of a silicone rubber. The relay substrate 25 is held by a positioning apparatus (not shown). By operations of the positioning apparatus, the positional relationship between the relay substrate 25 and the support substrate 24 can be controlled. Subsequently, the light emitting diodes 10 (110, 210, 310) to be mounted are irradiated, for example, with excimer laser beams from the back side of the support substrate 24 (see FIG. 14A). By this, laser ablation is generated, and the light emitting diodes 10 (110, 210, 310) irradiated with the excimer laser beam are peeled from the support substrate 24. Thereafter, the contact between the relay substrate 25 and the light emitting diodes 10 is canceled, whereon the light emitting diodes 10 peeled from the support substrate 24 are in the state of being adhered to the slightly tacky layer 26 (see FIG. 14B). The state of the support substrate 24 is schematically shown in FIG. 31B. As shown, one light emitting diode every sixth light emitting diode in the second direction, and one light emitting diode every third light emitting diode in the first direction, is in the state of being adhered to the slightly tacky layer 26.

Figure 32A:
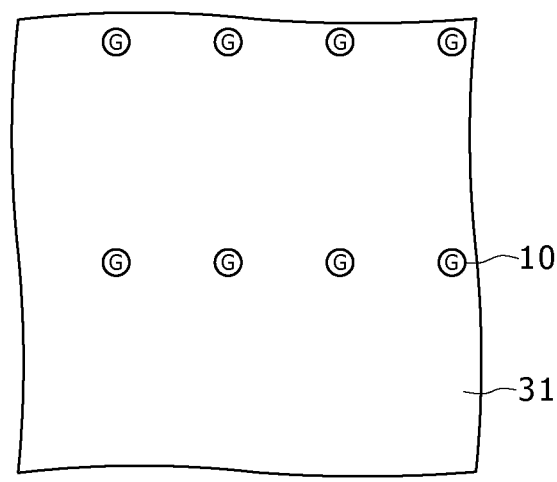
FIGS. 32A and 32B are schematic partial plan views for illustrating the method of manufacturing the light emitting diode display device according to Example 2.

Then, the light emitting diodes 10 (110, 210, 310) are disposed (moved or transferred) onto the burying material layer 33. Specifically, with reference to alignment marks formed on the first transfer substrate 31, the light emitting diodes 10 (110, 210, 310) are disposed from the relay substrate 25 onto the burying material layer 33 of the first transfer substrate 31. Since the light emitting diodes 10 (110, 210, 310) are being only weakly adhered to the slightly tacky layer 26, movement of the relay substrate 25 away from the first transfer substrate 31 in the condition where the light emitting diodes 10 (110, 210, 310) are in contact with (pressed against) the burying material layer 33 results in that the light emitting diodes 10 (110, 210, 310) are left on the burying material layer 33 which is in the uncured state. Further, the light emitting diodes 10 (110, 210, 310) are buried deeply into the burying material layer 33 by a roller or the like, whereby the light emitting diodes 10 (110, 210, 310) can be fixed (disposed) in the fixation layer 34. The state of the first transfer substrate 31 is schematically illustrated in FIG. 32A.

Figure 32B:
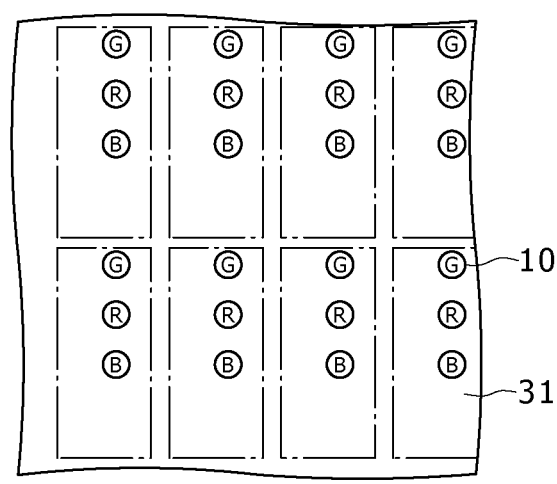

A system in which the relay substrate 25 is used as above is referred to as "step transfer method" for convenience. Such a step transfer method is repeated a desired number of times, whereby a desired number of the light emitting diodes 10 (110, 210, 310) are adhered onto the slightly tacky layer 26 in the pattern of a two-dimensional matrix, and transferred onto the first transfer substrate 31. Specifically, in Example 2, in a single step transfer, 120×90=10800 light emitting diodes 10 (110, 210, 310) are adhered to the slightly tacky layer 26 in the pattern of a two-dimensional matrix, and transferred onto the first transfer substrate 31. This is repeated 4×3 times. Further, the transfer onto the first transfer substrate 31 is conducted for each of the sets of the light emitting diodes 110, the light emitting diodes 210 and the light emitting diodes 310, so that the transfer is carried out a total of 4×3×3=36 times. In this manner, predetermined numbers of red light emitting diodes, green light emitting diodes and blue light emitting diodes can be mounted onto the first transfer substrate 31 at a predetermined interval or pitch. The state of the first transfer substrate 31 is schematically illustrated in FIG. 32B. In FIG. 32B, the light emitting unit is surrounded in dash-dot line. Besides, finally, the light emitting units are transferred onto and fixed on a display device substrate 61, to obtain a light emitting diode display device in which a plurality of light emitting units are arranged in a first direction and in a second direction orthogonal to the first direction in the pattern of a two-dimensional matrix. In this case, when 480×270=129600 light emitting units are transferred onto the display device substrate 61 in a single stroke, by repeating the transfer 16 times it is possible to obtain a light emitting diode display device including 1920×1080 light emitting units.

Thereafter, the burying material layer 33 which has a photosensitive resin in an uncured state and in which the light emitting diodes 10 (110, 210, 310) are arranged is irradiated with UV rays, whereby the photosensitive resin constituting the burying material layer 33 is cured. Consequently, a condition in which the light emitting diodes 10 (110, 210, 310) are fixed in the burying material layer 33 is obtained (see FIGS. 15A, 15B and 15C). In this condition, the first electrodes 14 (114, 214, 314) of the light emitting diodes 10 (110, 210, 310) are in an exposed state.

[Step 210B]

Next, the sub common electrode 43 is formed to range from the upper side of the respective first electrodes 114, 214, 314 in the light emitting diode group 110, 210, 310 composed of a desired number (in Example 2, $N_1$=1) of first light emitting diode(s) 110, a desired number (in Example 2, $N_2$=1) of second light emitting diode(s) 210 and a desired number (in Example 2, $N_3$=1) of third light emitting diode(s) 310 for forming the light emitting unit to the upper side of the fixation layer 34, based on a sputtering method and a lift-off method.

Figure 16A:
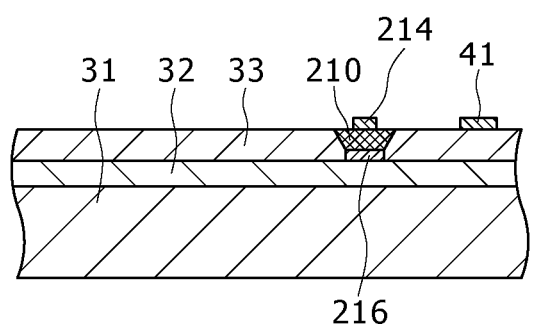
FIGS. 16A, 16B and 16C are schematic partial end views, equivalent to those respectively taken along arrow B-B, arrow E-E and arrow F-F of FIG. 7, for illustrating, in succession to FIGS. 15A, 15B and 15C, the method of manufacturing the light emitting diode display device according to Example 2.
Figure 16B:
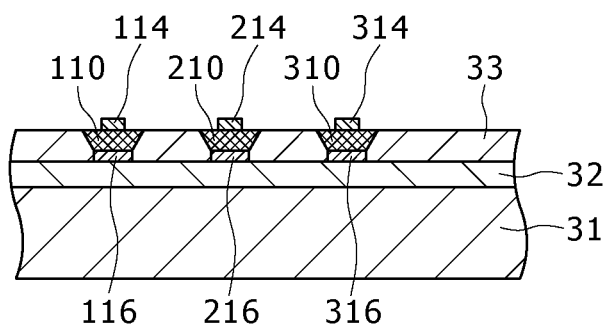
Figure 16C:
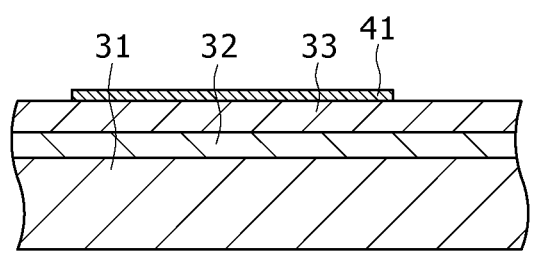

Specifically, first, based on the sputtering method and the lift-off method, a metallic layer 41 is formed on those portions of the fixation layer 34 which are located distant from the first electrodes 114, 214, 314 (see FIGS. 16A, 16B and 16C).

Figure 17A:
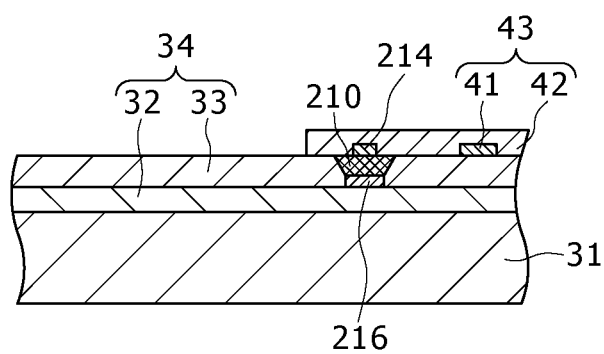
FIGS. 17A, 17B and 17C are schematic partial end views, equivalent to those respectively taken along arrow B-B, arrow E-E and arrow F-F of FIG. 7, for illustrating, in succession to FIGS. 16A, 16B and 16C, the method of manufacturing the light emitting diode display device according to Example 2.
Figure 17B:
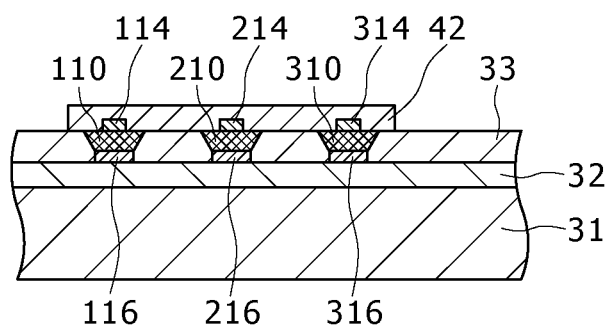
Figure 17C:
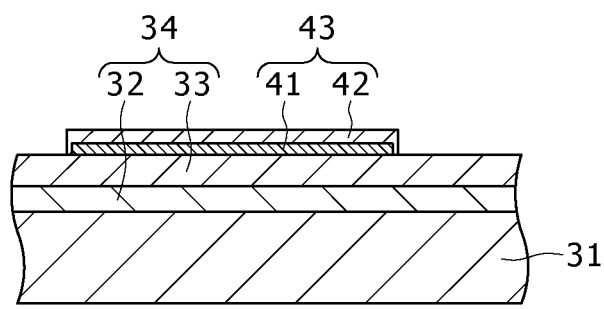
Figure 18A:
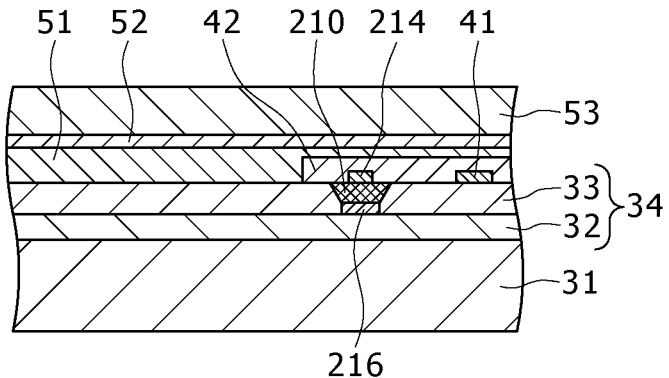
FIGS. 18A, 18B and 18C are schematic partial end views, equivalent to those respectively taken along arrow B-B, arrow E-E and arrow F-F of FIG. 7, for illustrating, in succession to FIGS. 17A, 17B and 17C, the method of manufacturing the light emitting diode display device according to Example 2.
Figure 18B:
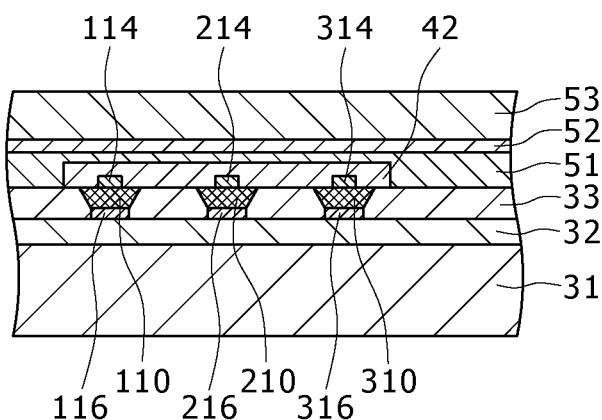
Figure 18C:
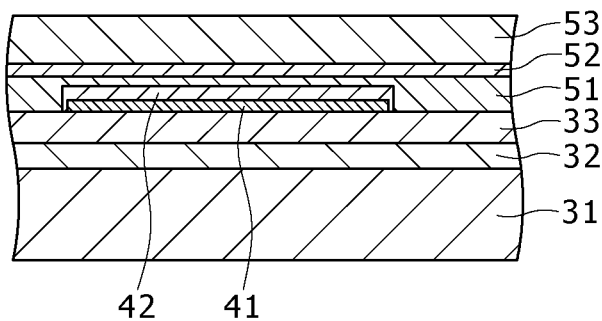
Figure 19A:
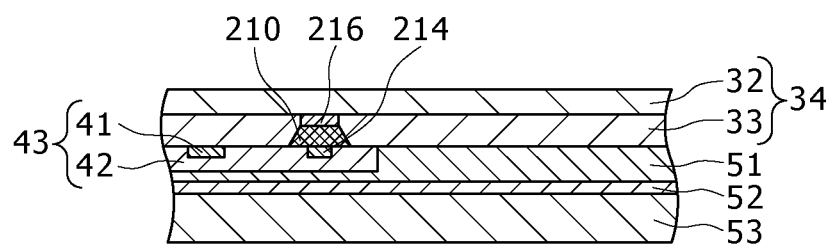
FIGS. 19A, 19B and 19C are schematic partial end views, equivalent to those respectively taken along arrow B-B, arrow E-E and arrow F-F of FIG. 7, for illustrating, in succession to FIGS. 18A, 18B and 18C, the method of manufacturing the light emitting diode display device according to Example 2.
Figure 19B:
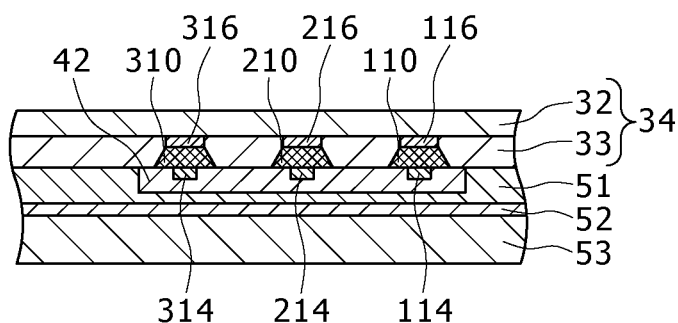
Figure 19C:
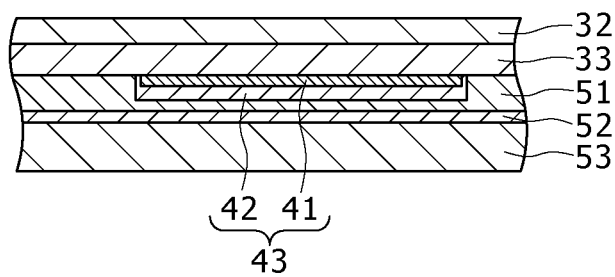
Figure 20A:
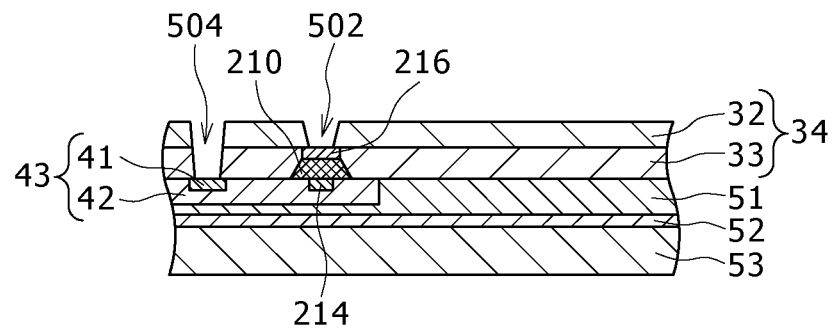
FIGS. 20A, 20B and 20C are schematic partial end views, equivalent to those respectively taken along arrow B-B, arrow E-E and arrow F-F of FIG. 7, for illustrating, in succession to FIGS. 19A, 19B and 19C, the method of manufacturing the light emitting diode display device according to Example 2.
Figure 20B:
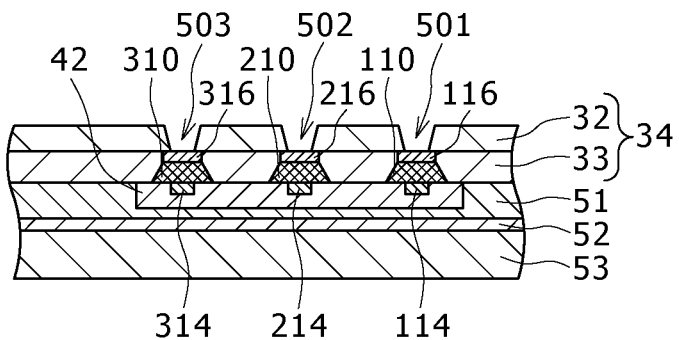
Figure 20C:
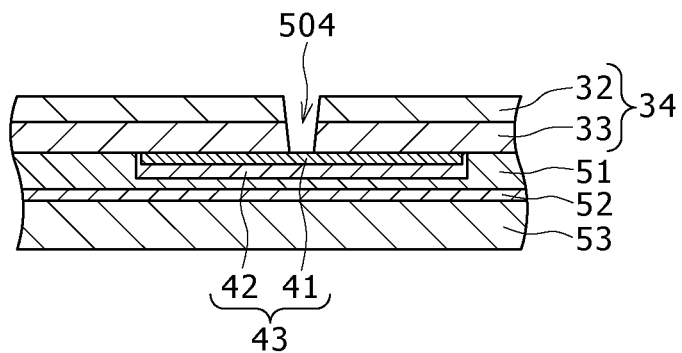
Figure 21A:
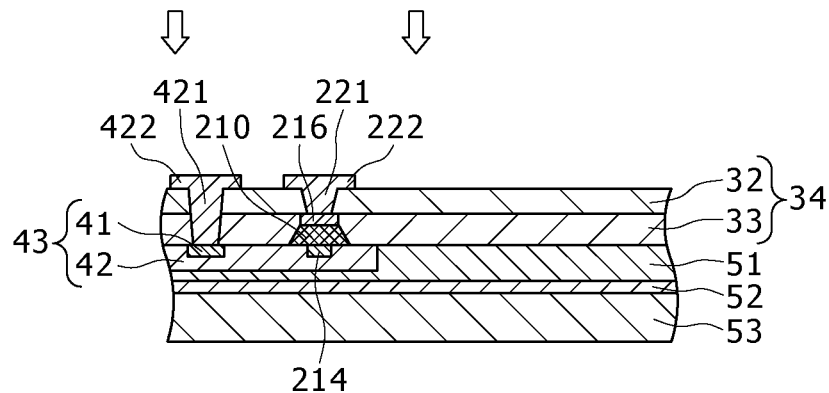
FIGS. 21A, 21B and 21C are schematic partial end views, equivalent to those respectively taken along arrow B-B, arrow E-E and arrow F-F of FIG. 7, for illustrating, in succession to FIGS. 20A, 20B and 20C, the method of manufacturing the light emitting diode display device according to Example 2.
Figure 21B:
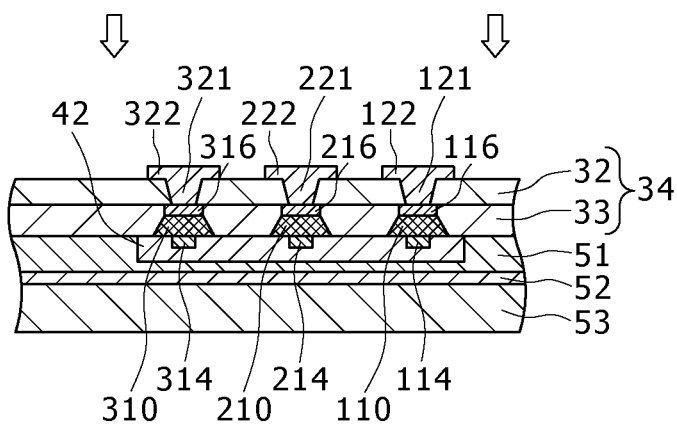
Figure 21C:
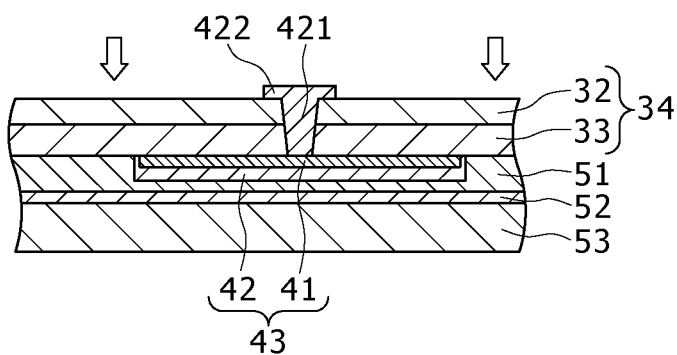
Figure 22A:
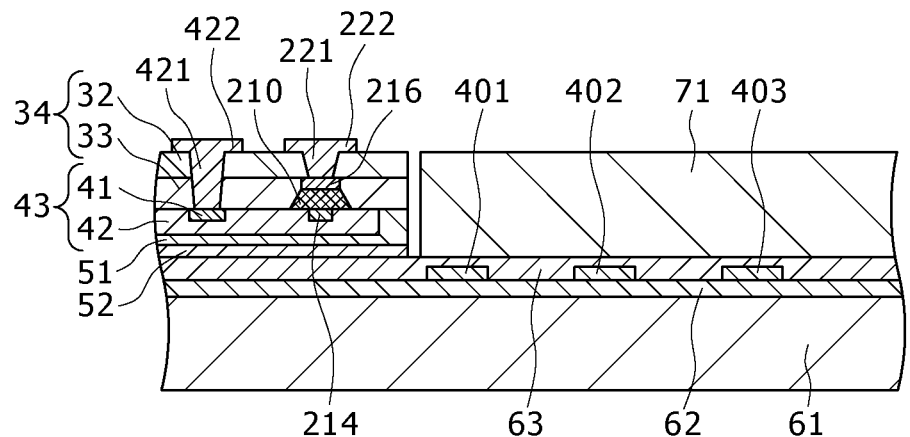
FIGS. 22A, 22B and 22C are schematic partial end views, equivalent to those respectively taken along arrow B-B, arrow E-E and arrow F-F of FIG. 7, for illustrating, in succession to FIGS. 21A, 21B and 21C, the method of manufacturing the light emitting diode display device according to Example 2.
Figure 22B:
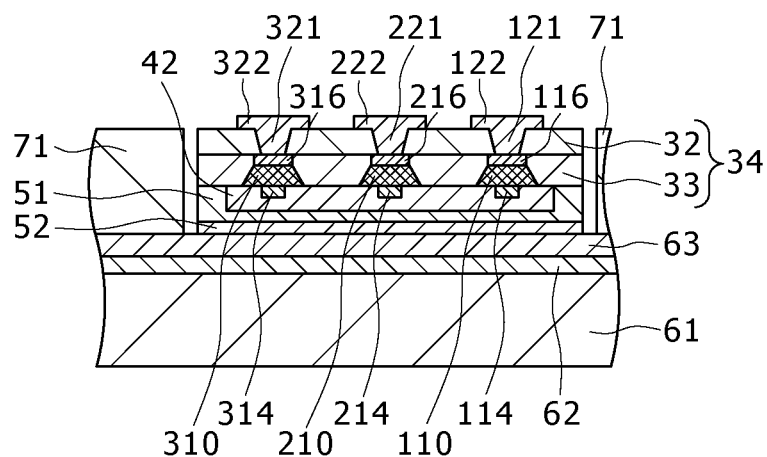
Figure 22C:
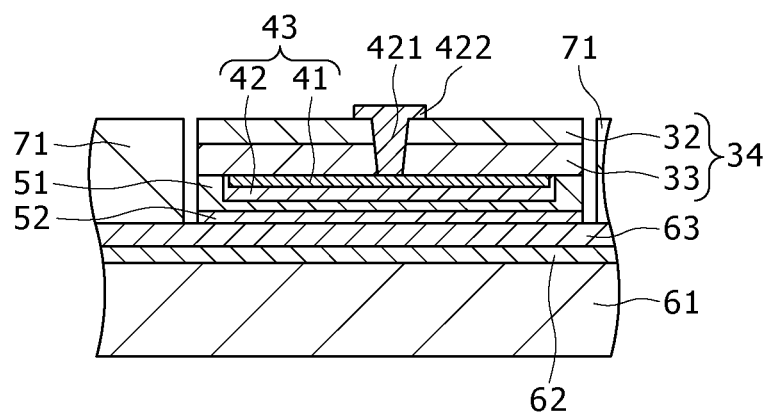
Figure 23A:
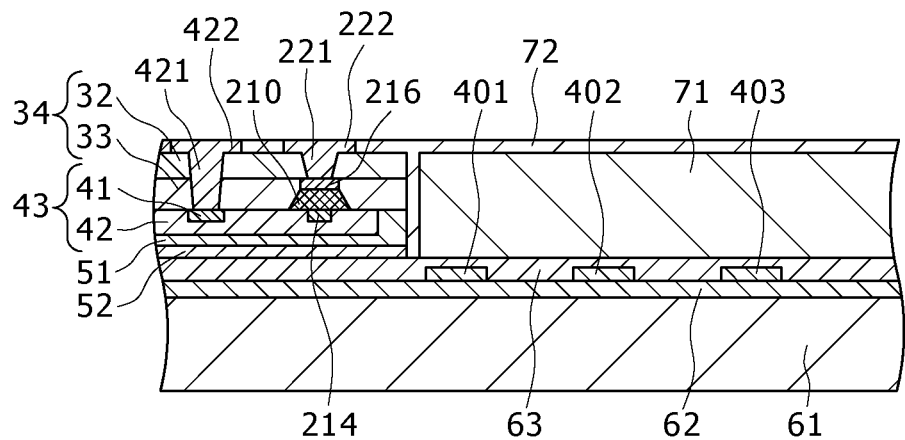
FIGS. 23A, 23B and 23C are schematic partial end views, equivalent to those respectively taken along arrow B-B, arrow E-E and arrow F-F of FIG. 7, for illustrating, in succession to FIGS. 22A, 22B and 22C, the method of manufacturing the light emitting diode display device according to Example 2.
Figure 23B:
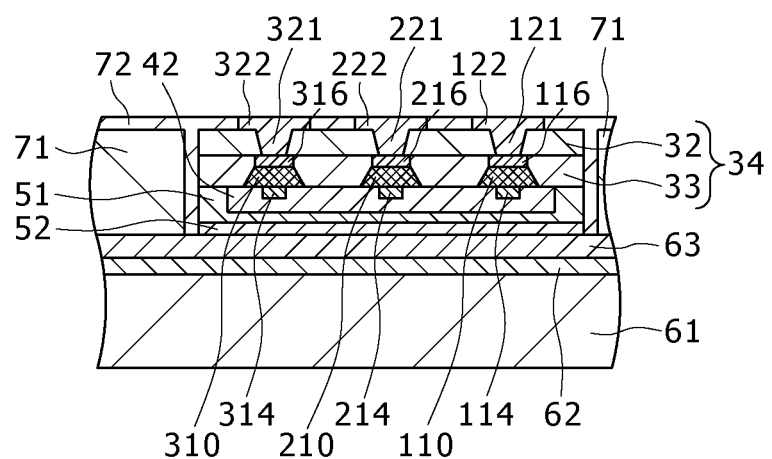
Figure 23C:
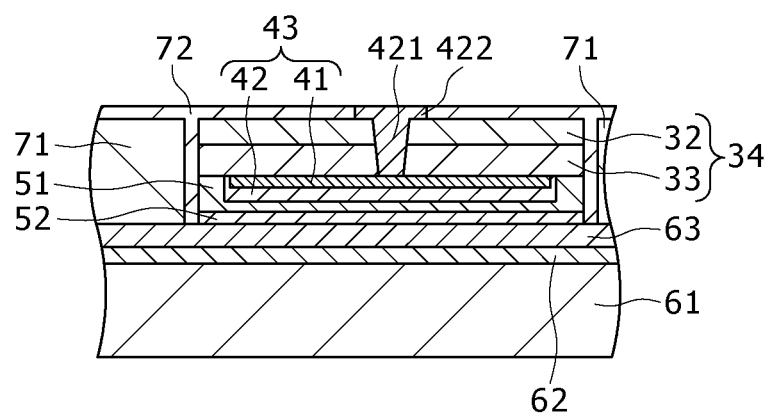
Figure 24A:
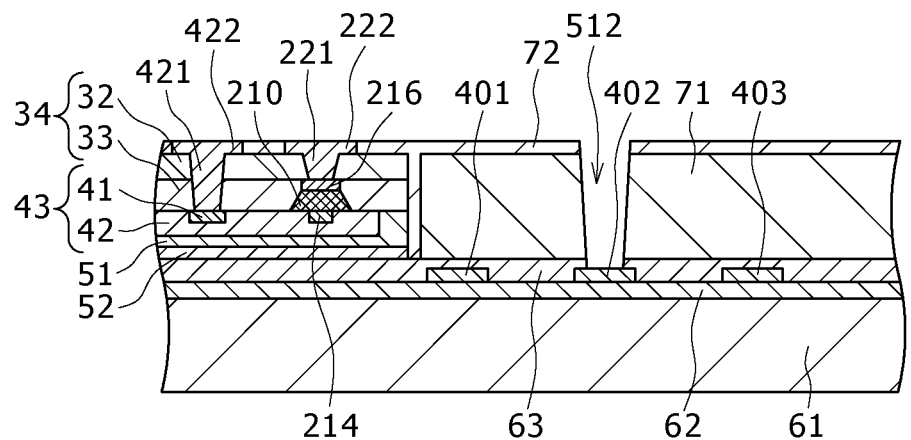
FIGS. 24A, 24B and 24C are schematic partial end views, equivalent to those respectively taken along arrow B-B, arrow E-E and arrow F-F of FIG. 7, for illustrating, in succession to FIGS. 23A, 23B and 23C, the method of manufacturing the light emitting diode display device according to Example 2.
Figure 24B:
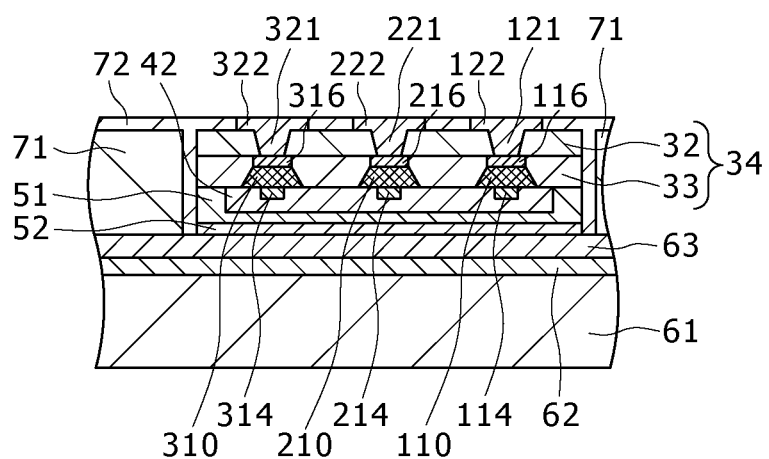
Figure 24C:
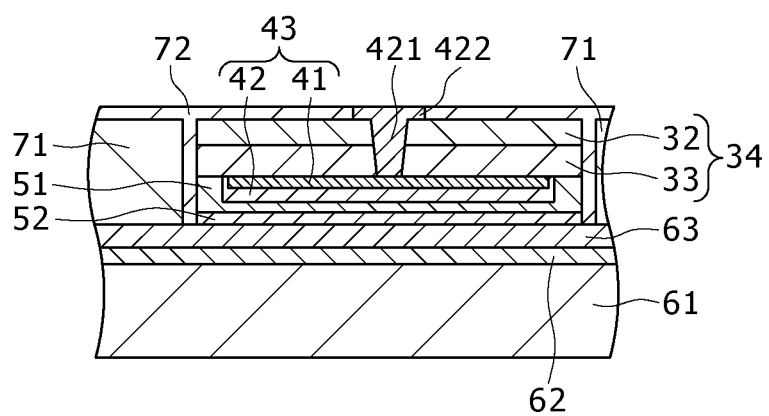
Figure 25A:
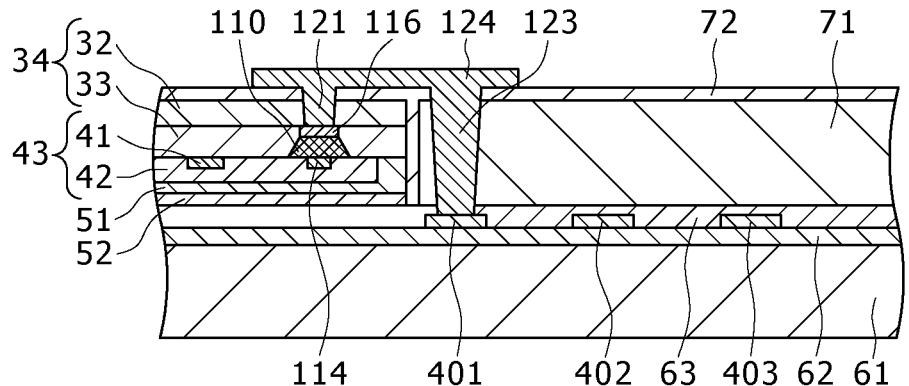
FIGS. 25A, 25B and 25C are schematic partial sectional views, similar to those respectively taken along arrow A-A, arrow B-B and arrow C-C of FIG. 7, of one light emitting unit in a light emitting diode display device according to Example 3.
Figure 25B:
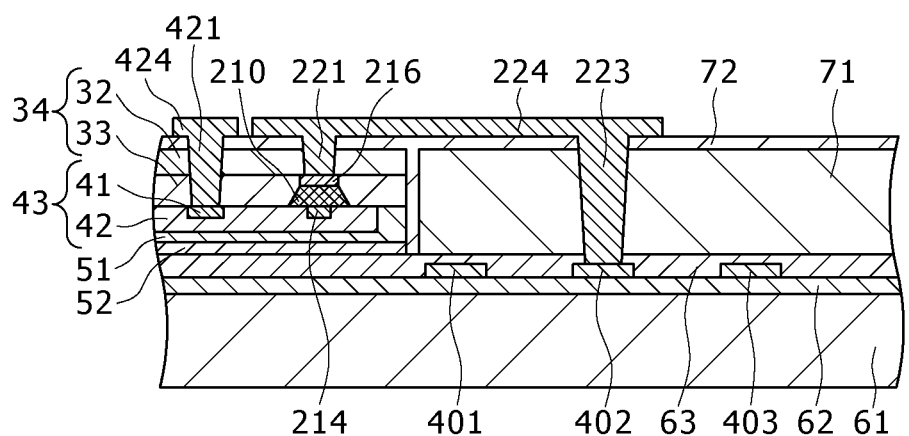
Figure 25C:
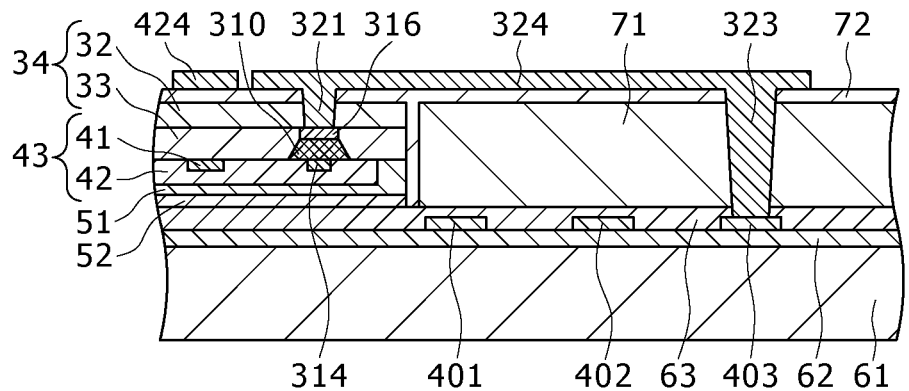
Figure 26A:
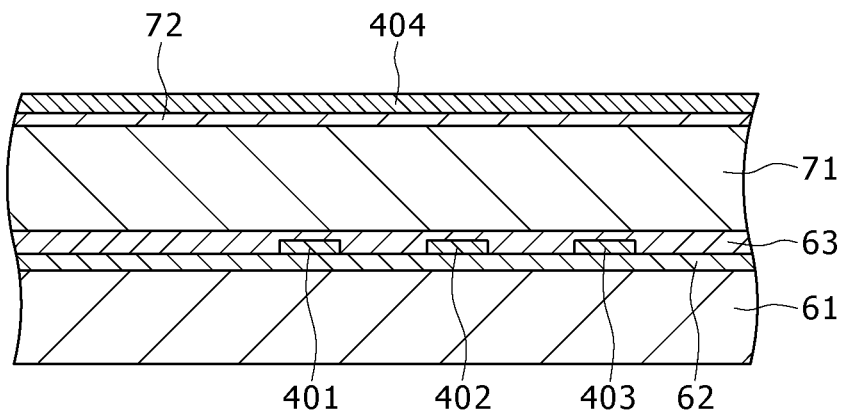
FIGS. 26A, 26B and 26C are schematic partial sectional views, similar to those respectively taken along arrow A-A, arrow B-B and arrow C-C of FIG. 7, of one light emitting unit in the light emitting diode display device according to Example 3.
Figure 26B:
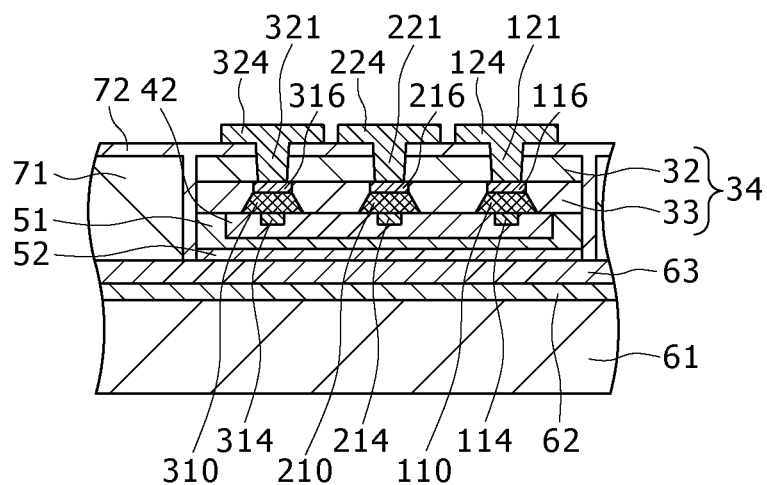
Figure 26C:
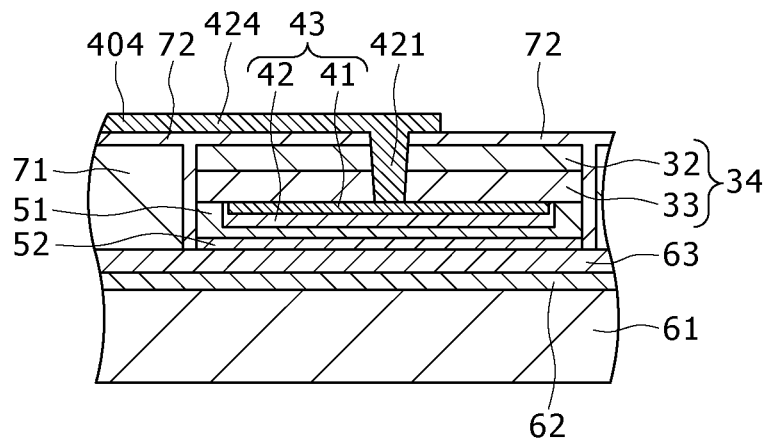

Next, a light-transmitting electrode 42 is formed on the fixation layer 34 to range from the upper side of the metallic layer 41 to the upper side of the first electrodes 114, 214, 314, based on the sputtering method and the lift-off method (see FIGS. 17A, 17B and 17C).

[Step 210C]

Thereafter, the light emitting diode groups 110, 210, 310 for forming the light emitting units are adhered to and tentatively fixed on the substrate 53 for manufacture of light emitting unit by way of the fixation layer 34 and the sub common electrode 43, and then the first transfer substrate 31 is removed. Specifically, the substrate 53 for manufacture of light emitting unit is prepared which is provided with a laser ablation layer 52 composed of a resin layer having a laser ablation property such as an epoxy resin, a polyimide resin, etc. and a third insulating layer 51 composed of an epoxy resin or the like and functioning also as an adhesive layer. The fixation layer 34 and the sub common electrode 43 are adhered to and tentatively fixed on the third insulating layer 51 (see FIGS. 18A, 18B and 18C). Thereafter, the assembly is irradiated, for example, with excimer laser beams from the side of the first transfer substrate 31. By this, laser ablation is generated, and the first transfer substrate 31 is peeled from the insulating material layer 32 (see FIGS. 19A, 19B and 19C).

[Step 210D]

Next, a first contact hole part 121 connected to the lead-out electrode 116 of the first light emitting diode 110 is formed in the fixation layer 34, and a first pad part 122 is formed which extends over the fixation layer 34 from the first contact hole part 121. Also, a second contact hole part 221 connected to the lead-out electrode 216 of the second light emitting diode 210 is formed in the fixation layer 34, and a second pad part 222 is formed which extends over the fixation layer 34 from the second contact hole part 221. Further, a third contact hole part 321 connected to the lead-out electrode 316 of the third light emitting diode 310 is formed in the fixation layer 34, and a third pad part 322 is formed which extends over the fixation layer 34 from the third contact hole part 321. Besides, a fourth contact hole part 421 connected to the sub common electrode 43 is formed in the fixation layer 34, and a fourth pad part 422 is formed which extends over the fixation layer 34 from the fourth contact hole part 421. In this manner, it is possible to obtain the light emitting unit. Specifically, based on a lithographic technique and an etching technique which have been known, opening regions 501, 502, 503, 504 are provided in the insulating material layer 32 on the upper side of the lead-out electrodes 116, 216, 316 and the metallic layer 41. Then, a metallic material layer is formed on the insulating material layer 32 inclusive of the inside of the opening regions 501, 502, 503, 504 by a sputtering method, and the metallic material layer is patterned, based on a lithographic technique and an etching technique which have been known. In this manner, it is possible to obtain the first contact hole part 121, the first pad part 122, the second contact hole part 221, the second pad part 222, the third contact hole part 321, the third pad part 322, the fourth contact hole part 421, and the fourth pad part 422 (see FIGS. 20A, 20B and 20C and FIGS. 21A, 21B and 21C).

[Step 210E]

Subsequently, the light emitting units having the light emitting diode groups 110, 210, 310 are isolated at the fixation layer 34, based on a laser irradiation method. Incidentally, in FIGS. 21A, 21B and 21C, the areas where laser irradiation is to be carried out are indicated by void arrows.

In Example 2, the layout pitch of the first light emitting diodes 110 in the light emitting diode display device or electronic apparatus is an integer times the manufacture pitch of the first light emitting diodes 110 in the first support substrate; the layout pitch of the second light emitting diodes 210 in the light emitting diode display device or electronic apparatus is an integer times the manufacture pitch of the second light emitting diodes 210 in the second support substrate; and the layout pitch of the third light emitting diodes 310 in the light emitting diode display device or electronic apparatus is an integer times the manufacture pitch of the light emitting diodes 310 in the third support substrate. Specifically, the layout pitch of the light emitting diodes 110, 210, 310 in the light emitting diode display device or electronic apparatus along the second direction was set to be six times the manufacture pitch of the light emitting diodes 110, 210, 310 in the support substrate, and the layout pitch of the light emitting diodes 110, 210, 310 in the light emitting diode display device or electronic apparatus along the first direction was set to be three times the manufacture pitch of the light emitting diodes 110, 210, 310 in the support substrate.

(Step 220)

Specifically, first, the light emitting units are transferred from the substrate 53 for manufacture of light emitting device onto the display device substrate 61 and fixed on the latter, to thereby obtain an electronic apparatus having a light emitting diode display device in which a plurality of light emitting units are arranged in a first direction and a second direction orthogonal to the first direction in the pattern of a two-dimensional matrix.

More specifically, a display device substrate 61 is prepared which has a second insulating material layer 71, a first common electrode 401, a second common electrode 402 and a third common electrode 403 extending in a second direction. Here, the first common electrode 401, the second common electrode 402 and the third common electrode 403 are covered with the second insulating material layer 71. The display device substrate 61 is covered with a fourth insulating layer 62, and the first common electrode 401, the second common electrode 402 and the third common electrode 403 are formed on the fourth insulating layer 62. In addition, the fourth insulating layer 62, the first common electrode 401, the second common electrode 402 and the third common electrode 403 are covered with a fifth insulating layer 63 which functions also as an adhesive layer. Further, the second insulating material layer 71, more specifically, is formed on the fifth insulating layer 63. The second insulating material layer 71 is not formed on those portions of the display device substrate 61 on which to fix the light emitting units. Besides, those portions of the fifth insulating layer 63 in which to fix the light emitting units are left uncured, whereas the other portions of the fifth insulating layer 63 are in the cured state. The display device substrate 61 having such a configuration and structure can be manufactured by a known method.

[Step 220A]

Specifically, first, the light emitting units are adhered to a second transfer substrate (not shown), and then the substrate 53 for manufacture of light emitting unit is removed. More specifically, it suffices to carry out a step substantially the same as [Step 210A-(2)] described above. Specifically, the assembly is irradiated, for example, with excimer laser beams from the back side of the substrate 53 for manufacture of light emitting unit. By this, laser ablation is generated, and the substrate 53 for manufacture of light emitting unit is peeled from the laser ablation layer 52.

[Step 220B]

Next, the light emitting units are arranged on the display device substrate 61 so as to be surrounded by the second insulating material layer 71, and then the second transfer substrate is removed. Specifically, the light emitting units and the fixation layer 34 surrounding them are disposed (moved or transferred) onto the exposed fifth insulating layer 63 surrounded by the second insulating material layer 71 (see FIGS. 22A, 22B and 22C). More specifically, with reference to alignment marks formed on the second transfer substrate, the light emitting units and the fixation layer 34 surrounding them are disposed from the second transfer substrate 31 onto the exposed fifth insulating layer 63 surrounded by the second insulating material layer 71. Since the light emitting units and the fixation layer 34 surrounding them are being only weekly adhered to a slightly tacky layer (not shown), when the second transfer substrate is moved away from the display device substrate 61 in the condition where the light emitting units and the fixation layer 34 surrounding them are put in contact with (pressed against) the fifth insulating layer 63, the light emitting units and the fixation layer 34 surrounding them are left on the fifth insulating layer 63. Further, the light emitting units and the fixation layer 34 surrounding them are buried deep into the fifth insulating layer 63 by a roller or the like, whereby the light emitting units and the fixation layer 34 surrounding them can be fixed (arranged) in the fifth insulating layer 63. After the arrangement of all the light emitting units is completed, the fifth insulating layer 63 is cured.

[Step 220C]

Thereafter, a planarizing layer 72 composed of an insulating resin is formed on the whole surface by a spin coating method, to obtain a planarizing layer 72 which has a planarized surface. In this manner, a structure shown in FIGS. 23A, 23B and 23C can be obtained.

[Step 220D]

Subsequently, a second-A connection part 124 and a contact part 123 for electrically interconnecting a first pad part 122 and the first common electrode 401 are formed to range from the fixation layer 34 to the second insulating material layer 71. In addition, a second-B connection part 224 and a contact part 223 for electrically interconnecting a second pad part 222 and the second common electrode 402 are formed to range from the fixation layer 34 to the second insulating material layer 71. Besides, a second-C connection part 324 and a contact part 323 for electrically interconnecting a third pad part 322 and the third common electrode 403 are formed to range from the fixation layer 34 to the second insulating material layer 71. In addition, the fourth common electrode 404 is formed on the second insulating material layer 71. Further, a third connection part 424 for electrically interconnecting a fourth pad part 422 and the fourth common electrode 404 are formed to range from the fixation layer 34 to the second insulating material layer 71 (see FIGS. 24A, 24B and 24C).

Specifically, based on a lithographic technique and an etching technique, an opening region (in the example shown in FIGS. 24A to 24C, an opening region 512) is formed in the planarizing layer 72, the second insulating material layer 71 and the fifth insulating layer 63. Next, based on a sputtering technique, a lithographic technique and an etching technique, the second-A connection part 124, the contact part 123, the second-B connection part 224, the contact part 223, the second-C connection part 324, the contact part 323 and the third connection part 424 are formed. In this manner, a structure as shown in FIGS. 8A, 8B and 8C and FIGS. 9A, 9B and 9C can be obtained.

In Example 2 or in Example 3 which will be described later, a plurality of light emitting units in which the respective first electrodes 114, 214, 314 of the first light emitting diode(s) 110, the second light emitting diode(s) 210 and the third light emitting diode(s) 310 are connected to the sub common electrode 43 is transferred onto the display device substrate 61; further, they are fixed to the display device substrate 61, with the second electrodes directed up. Therefore, the subsequent laying-around of the respective second electrodes of the first light emitting diode(s) 110, the second light emitting diode(s) 210 and the third light emitting diode(s) 310 to the common electrodes (common wirings) 401, 402, 403 and the laying-around of the first electrodes 114, 214, 314 to the first wiring (fourth common electrode 404) are facilitated. This promises a reduction of the fine processing process, and a facilitated manufacturing process for the light emitting diode display device or electronic apparatus. In addition, since the proportion of the area of the light emitting diodes 110, 210, 310 based on the area of one pixel is low, and, since the light emitting diodes 110, 210, 310 are arranged close to one another, the possibility of occurrence of the so-called color breakup is lowered.

Example 3

Example 3 is a modification of Example 2. The configuration and structure of a light emitting diode display device or electronic apparatus obtained by a method of manufacturing a light emitting diode display device or electronic apparatus in Example 3 as illustrated by schematic partial sectional views in FIGS. 25A, 25B, 25C and FIGS. 26A, 26B, 26C are substantially the same as the configuration and structure of the light emitting diode display device or electronic apparatus in Example 2 above, except that the first pad part, the second pad part, the third pad part and the fourth pad part are not formed, and, therefore, detailed description thereof will be omitted. Incidentally, FIGS. 25A, 25B, 25C, 26A, 26B and 26C are schematic partial sectional views similar to those taken along arrows A-A, B-B, C-C, D-D, E-E and F-F of FIG. 7, respectively.

Figure 27A:
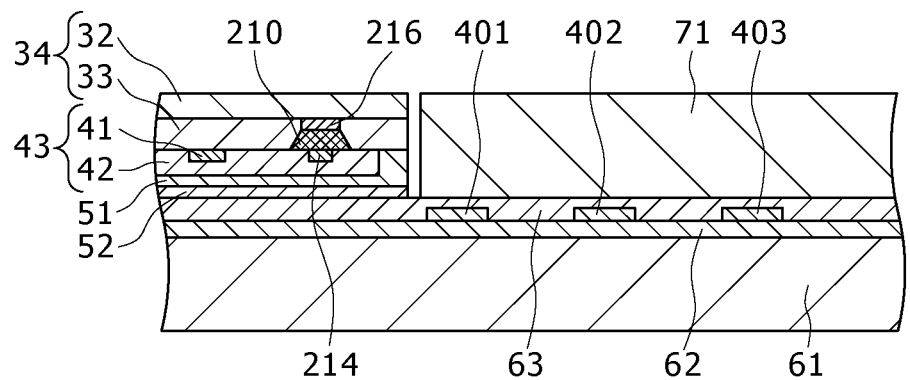
FIGS. 27A, 27B and 27C are schematic partial sectional views, similar to those respectively taken along arrow A-A, arrow B-B and arrow C-C of FIG. 7, of one light emitting unit in the light emitting diode display device according to Example 3.
Figure 27B:
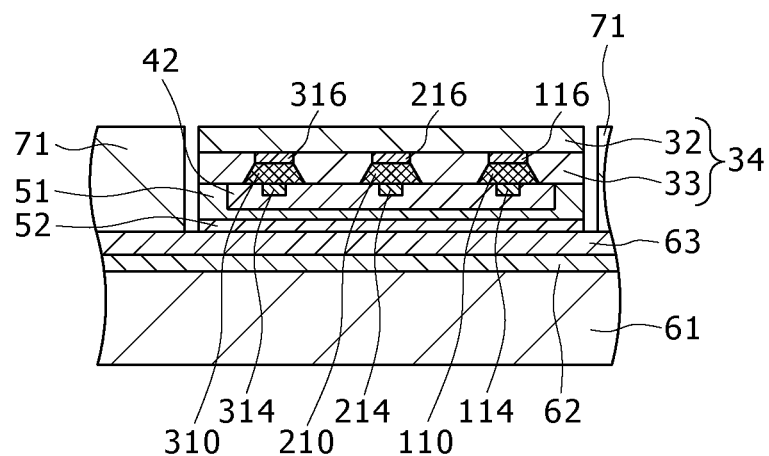
Figure 27C:
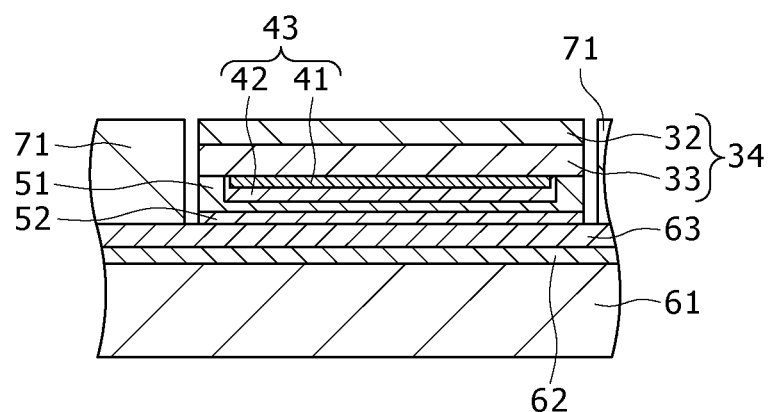
Figure 28A:
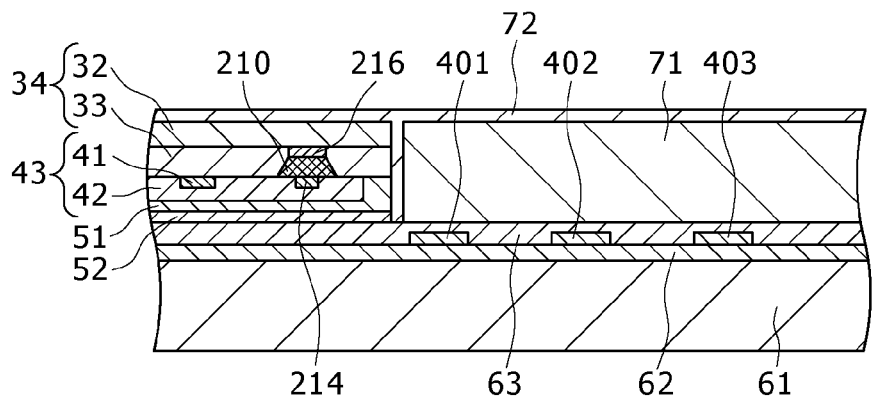
FIGS. 28A, 28B and 28C are schematic partial end views, equivalent to those respectively taken along arrow B-B, arrow E-E and arrow F-F of FIG. 7, for illustrating, in succession to FIGS. 27A, 27B and 27C, the method of manufacturing the light emitting diode display device according to Example 3.
Figure 28B:
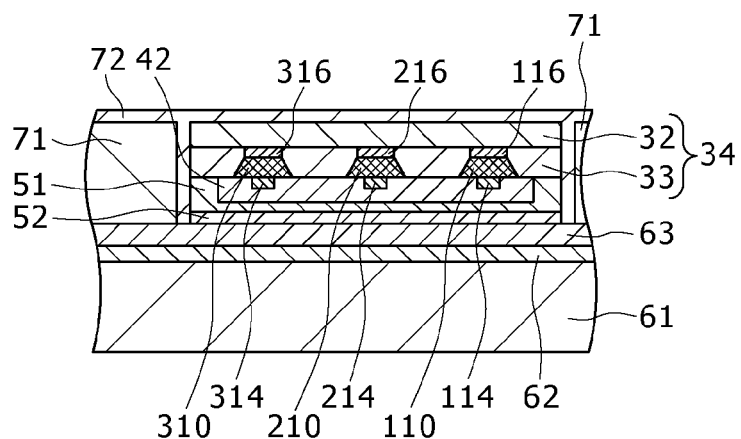
Figure 28C:
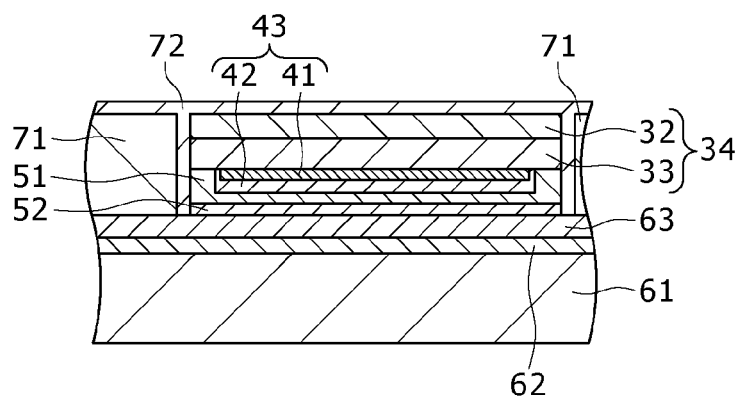
Figure 29A:
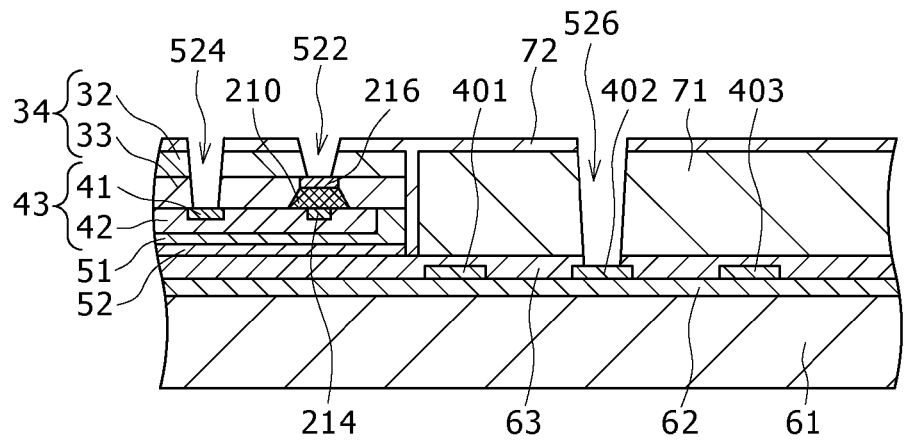
FIGS. 29A, 29B and 29C are schematic partial end views, equivalent to those respectively taken along arrow B-B, arrow E-E and arrow F-F of FIG. 7, for illustrating, in succession to FIGS. 28A, 28B and 28C, the method of manufacturing the light emitting diode display device according to Example 3.
Figure 29B:
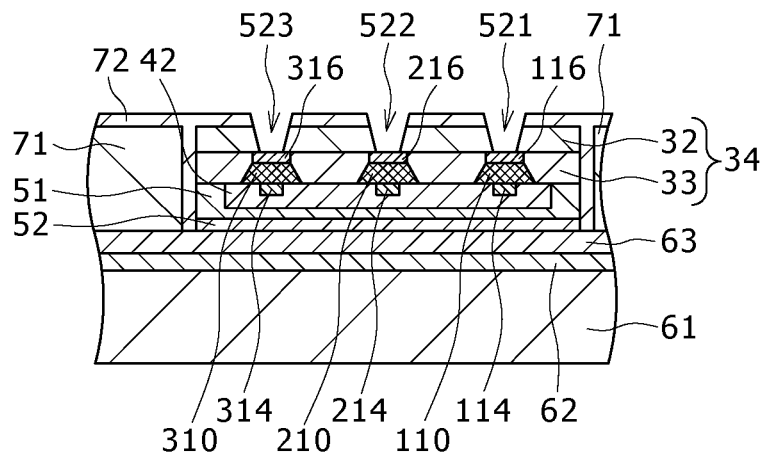
Figure 29C:
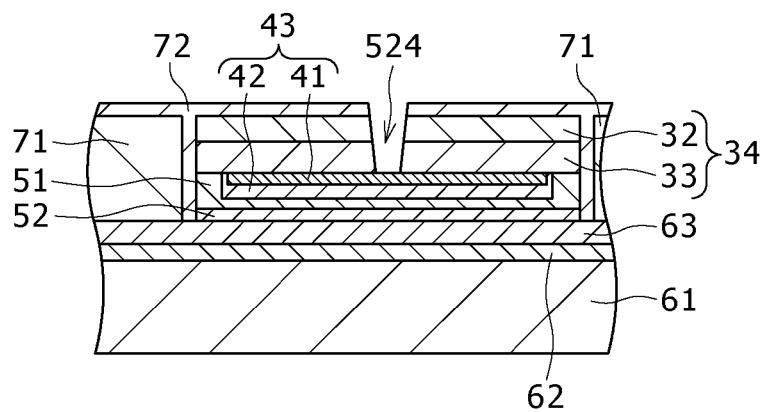

Now, the method of manufacturing a light emitting diode display device or electronic apparatus in Example 3 will be described below referring to FIGS. 27A, 27B, 27C, FIGS. 28A, 28B, 28C and FIGS. 29A, 29B, 29C. Incidentally, FIGS. 27A, 28A and 29A are schematic partial end views equivalent to those taken along arrow B-B of FIG. 7; FIGS. 27B, 28B and 29B are schematic partial end views equivalent to those taken along arrow E-E of FIG. 7; and FIGS. 27C, 28C and 29C are schematic partial end views equivalent to those taken along arrow F-F of FIG. 7.

[Step 300]

First, light emitting diodes 10 (110, 210, 310) are manufactured by a method similar to [Step 200] of Example 2. Next, [Step 210A] and [Step 210B] of Example 2 are carried out. Further, the light emitting diode group 110, 210, 310 for forming the light emitting units are adhered to the substrate 53 for manufacture of light emitting unit, through the fixation layer 34 and the sub common electrode 43, in the same manner as in [Step 210C] of Example 2. Then, the first transfer substrate 31 is removed. Thereafter, a step similar to [Step 210E] of Example 2 is carried out, whereby the light emitting units are isolated at the fixation layer 34.

(Step 310)

On the other hand, in the same manner as in Example 2, a display device substrate 61 is prepared in which a second insulating material layer 71 and a first common electrode 401, a second common electrode 402 and a third common electrode 403 extending in the first direction and covered with the second insulating material layer 71 are formed.

[Step 310A]

Then, in the same manner as in [Step 220A] of Example 2, the light emitting units are adhered to a second transfer substrate (not shown), and thereafter the substrate 53 for manufacture of light emitting unit is removed.

[Step 310B]

Subsequently, in the same manner as in [Step 220B] and [Step 220C] of Example 2, the light emitting units are disposed on a display device substrate 61 so as to be surrounded by the second insulating material layer 71, and then the second transfer substrate is removed (see FIGS. 27A, 27B, 27C and FIGS. 28A, 28B, 28C).

[Step 310C]

Thereafter, for electrically connecting a lead-out electrode 116 of the first light emitting diode 110 and the first common electrode 401 to each other, a first contact hole part 121 is formed in the fixation layer 34, and a first connection part 124 and a contact part 123 are formed to range from the fixation layer 34 to a planarizing layer 72 and to the second insulating layer 71. In addition, for electrically connecting a lead-out electrode 216 of the second light emitting diode 210 and the second common electrode 402 to each other, a second contact hole part 221 is formed in the fixation layer 34, and a second connection part 224 and a contact part 223 are formed to range from the fixation layer 34 to the planarizing layer 72 and to the second insulating material layer 71. Besides, for electrically interconnecting a lead-out electrode 316 of the third light emitting diode 310 and the third common electrode 403, a third contact hole part 321 is formed in the fixation layer 34, and a third connection part 324 and a contact part 323 are formed to range from the fixation layer 34 to the planarizing layer 72 and to the second insulating material layer 71. In addition, the fourth common electrode 404 is formed on the second insulating material layer 71. Further, for electrically connecting a sub common electrode 43 and the fourth common electrode 404 to each other, a fourth contact hole part 421 is formed in the fixation layer 34, and a fourth connection part 424 is formed to range from the fixation layer 34 to the planarizing layer 72 and to the second insulating material layer 71.

Specifically, based on a lithographic technique and an etching technique which have been known, opening regions 521, 522, 523, 524 are formed in the planarizing layer 72, the second insulating material layer 71 and the insulating material layer 32 which are located on the upper side of the lead-out electrodes 116, 216, 316 and the metallic layer 41. In addition, opening regions are formed in the planarizing layer 72, the second insulating material layer 71 and the insulating material layer 32 which are located on the upper side of the first common electrode 401, the second common electrode 402, the third common electrode 403 and the fourth common electrode 404 (see FIGS. 29A, 29B and 29C). Incidentally, only the opening region 526 is shown in FIG. 29A. Then, a metallic material layer is formed on the insulating material layer 32 inclusive of the inside of the opening regions 521, 522, 523, 524, and 526 by sputtering. Subsequently, based on a lithographic technique and an etching technique which have been known, the metallic material layer is patterned, whereby it is possible to obtain the first contact hole part 121, the second contact hole part 221, the third contact hole part 321, the fourth contact hole part 421, the second-A connection part 124, the contact part 123, the second-B connection part 224, the contact part 223, the second-C connection part 324, the contact part 323, and the third connection part 424 (see FIGS. 25A, 25B, 25C and FIGS. 26A, 26B, 26C).

While the present invention has been described above referring to preferred examples, the invention is not to be limited to the examples. The configurations and structures of the semiconductor light emitting device (light emitting diode) and the light emitting diode display device or electronic apparatus with the light emitting diodes incorporated therein as described in the above examples are merely for exemplification, so that the members, materials and the like constituting them are also merely for exemplification, so that modifications can be made, as required. The numerical values, materials, configurations, structures, shapes, various substrates, raw materials, processes, etc. mentioned in the examples above are merely for exemplification, so that numerical values, materials, configurations, structures, shapes, substrates, raw materials, processes, etc. different from the above-mentioned ones can also be employed as required.

While the sub common electrode 43 is composed of the metallic layer 41 and the light-transmitting electrode 42 in the above examples, the sub common electrode 43 may alternatively be composed only of a metallic layer or alloy layer, insofar as it does not obstruct the emission of light from the light emitting diodes. Besides, in some cases, the first electrodes 114, 214, 314 may be formed after [Step 210A-(2)] of Example 2 or in [Step 210B].

As the light emitting diodes constituting the light emitting unit, further, a fourth light emitting diode, a fifth light emitting diode . . . may be provided in addition to the first, second and third light emitting diodes. Examples of such a configuration include a light emitting unit in which a sub pixel for emitting white light is added for enhancing luminance, a light emitting unit in which a sub pixel for emitting complementary-color light are added for widening the color reproduction range, a light emitting unit in which a sub pixel for emitting yellow light is added for widening the color reproduction range, and a light emitting unit in which a sub pixel for emitting yellow light and a sub pixel for emitting cyan light are added for broadening the color reproduction range. In such a case, it suffices that first electrodes constituting the fourth light emitting diode, the fifth light emitting diode . . . are connected to the sub common electrode.

The image display device (light emitting diode display device) is not limited to flat-panel direct-viewing type image display devices represented by TV sets and computer terminals, but include image display devices of the type in which images are projected onto the human retina and image display devices of the projection type. In such an image display device as just-mentioned, a field sequential type driving system may, for example, be adopted in which images are displayed through time shared control of the respective emission/non-emission states of the first, second and third light emitting diodes.

Figure 30:
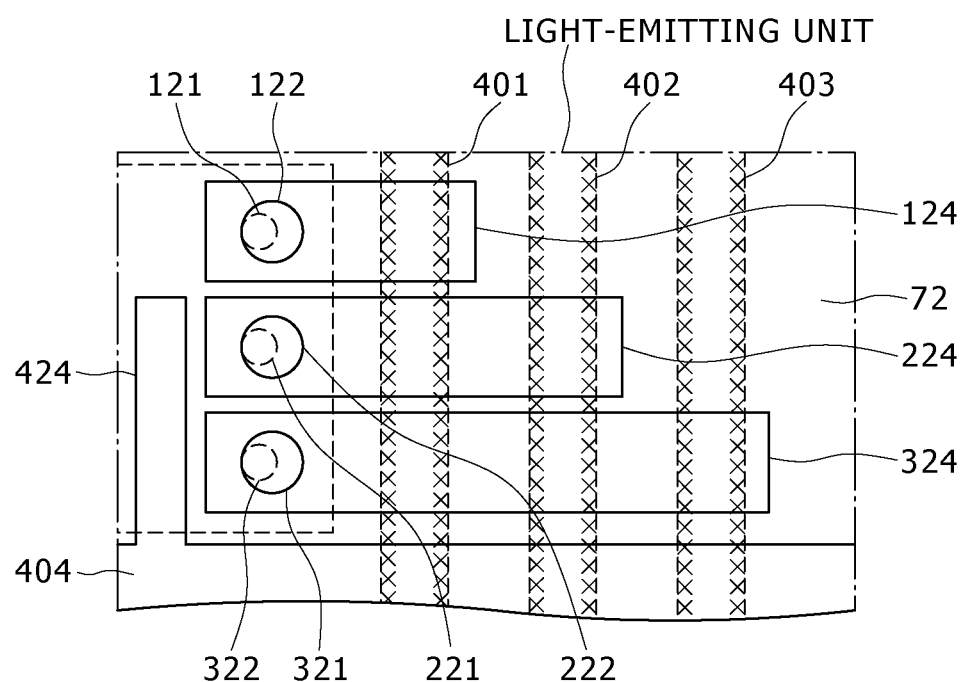
FIG. 30 is a schematic plan view of one light emitting unit in a modification of the light emitting diode display device according to Example 2.

A schematic plan view of one light emitting unit in a modification of the light emitting diode display device in Example 2 is shown in FIG. 30. In this modification, the center of the first pad part 122 (in FIG. 30, indicated by a thin solid line) closing the first contact hole part 121 (in FIG. 30, indicated by a broken like) is not coincident with the center of the first contact hole part 121; specifically, the center of the first pad part 122 is deviated to the side of the first common wiring 401. In addition, the center of the second pad part 222 (in FIG. 30, indicated by a thin solid line) closing the second contact hole part 221 (in FIG. 30, indicated by a broken line) is not coincident with the center of the second contact hole part 221; specifically, the center of the second pad part 222 is deviated to the side of the second common wiring 402. Further, the center of the third pad part 322 (in FIG. 30, indicated by a thin solid line) closing the third contact hole part 321 (in FIG. 30, indicated by a broken line) is not coincident with the center of the third contact hole part 321; specifically, the center of the third pad part 322 is deviated to the side of third common wiring 403. When such a configuration is adopted, at the time of forming the first connection part 124, the second connection part 224 and the third connection part 324, spatial room can be obtained between these connection parts 124, 224, 324 and the fourth connection part 424, so that short-circuit can be securely prevented from being generated between these connection parts 124, 224, 324 and the fourth connection part 424.

Depending on the structure of the electronic apparatus, the first wiring may be composed of a common wiring (common electrode), and the second wiring may be provided with the same structure as that of the first wiring or second wiring described in Example 2 above. Or, alternatively, the first wiring may be provided with the same structure as that of the first wiring or second wiring described in Example 2 above, and the second wiring may be composed of a common wiring (common electrode). Or, further, a configuration may be adopted in which the first wiring is composed of a common wiring (common electrode) and the second wiring is also composed of a common wiring (common electrode). Incidentally, the common wiring may be in a single sheet-like form, or a multi-sheet form or a belt-like form, depending on the structure of the electronic apparatus. In the case where the semiconductor light emitting devices (light emitting diodes)

are AC driven, a semiconductor light emitting device (light emitting diode) having the first connection part in contact with the first wiring and having the second connection part in contact with the second wiring and a semiconductor light emitting device (light emitting diode) having the second connection part in contact with the first wiring and having the first connection part in contact with the second wiring may be present in a mixed manner. Incidentally, in the case of the semiconductor light emitting device (light emitting diode) having the second connection part in contact with the first wiring and having the first connection part in contact with the second wiring, it suffices that the second wiring part in contact with the first wiring is taken as "first connection part" and the first wiring part in contact with the second wiring is taken as "second connection part" in reading the foregoing description.

The present application contains subject matter related to that disclosed in Japanese Priority Patent Application JP 2009-213194 filed in the Japan Patent Office on Sep. 15, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor light emitting device comprising:
a first compound semiconductor layer including a first clad layer and a first contact layer, the first clad layer on the first contact layer;
an active layer on the first clad layer of the first compound semiconductor layer;
a second compound semiconductor layer on the active layer, the second compound semiconductor layer including a second clad layer and a second contact layer in this order proceeding from the active layer;
a first electrode electrically connected to the first contact layer of the first compound semiconductor layer; and
a second electrode on the second contact layer, the second electrode and the first electrode being non-overlapping at least in cross-section,
wherein,
the first electrode is not carried on the first contact layer, and
the second contact layer is smaller than the second clad layer.

2. The semiconductor light emitting device of claim 1, wherein the second contact layer is substantially a same size as the second electrode.

3. The semiconductor light emitting device of claim 1, wherein the second electrode covers the second contact layer.

4. The semiconductor light emitting device of claim 2, wherein an average area $S_1$ of the second contact layer and an average area $S_2$ of the second electrode satisfy a relation of $\frac{1}{2} \leq S_2/S_1 \leq 2$.

5. The semiconductor light emitting device of claim 2, wherein an average area $S_1$ of the second contact layer and an average area $S_2$ of the second electrode satisfy a relation of $S_2/S_1 = 1.05$.

6. The semiconductor light emitting device of claim 1, wherein the active layer includes a GaInP compound semiconductor layer and is doped with an impurity.

7. The semiconductor light emitting device of claim 6, wherein a concentration of an n-type impurity in the active layer is in a range of $5 \times 10^{15}/cm^3$ to $1 \times 10^{18}/cm^3$.

8. The semiconductor light emitting device of claim 6, wherein:
the first clad layer comprises a first AlGaInP compound semiconductor layer, and
the second clad layer comprises a second AlGaInP compound semiconductor layer.

9. The semiconductor light emitting device of claim 8, wherein:
the first compound semiconductor layer is n-type, and
the second compound semiconductor layer is p-type.

10. An image display device including a plurality of light emitting devices, each of the light emitting devices including:
a first compound semiconductor layer, the first compound semiconductor layer including a first clad layer and a first contact layer, the first clad layer on the first contact layer;
an active layer on the first clad layer of the first compound semiconductor layer;
a second compound semiconductor layer on the active layer, the second compound semiconductor layer including a second clad layer and a second contact layer in this order from a side of the active layer;
a first electrode electrically connected to the first contact layer of the first compound semiconductor layer; and
a second electrode on the second contact layer, the second electrode and the first electrode being non-overlapping at least in cross-section,
wherein,
the first electrode is not carried on the first contact layer, and
the second contact layer is smaller than the second clad layer.

11. A method of manufacturing a semiconductor light emitting device, said method comprising:
forming a first compound semiconductor layer, the first compound semiconductor layer including a first clad layer and a first contact layer, the first clad layer on the first contact layer;
forming an active layer on the first clad layer of the first compound semiconductor layer;
forming a second compound semiconductor layer on the active layer, the second compound semiconductor layer including a second clad layer and a second contact layer in this order from the active layer side;
forming a first electrode that is electrically connected to the first contact layer of the first compound semiconductor layer; and
forming a second electrode on the second contact layer, the second electrode and the first electrode being non-overlapping at least in cross-section,
wherein,
the first electrode is not carried on the first contact layer, and
the second contact layer is smaller than the second clad layer.

12. The image display device of claim 10, wherein the second contact layer is substantially a same size as the second electrode.

13. The image display device of claim 10, wherein the second electrode covers the second contact layer.

14. The image display device of claim 12, wherein an average area $S_1$ of the second contact layer and an average area $S_2$ of the second electrode satisfy a relation of $\frac{1}{2} \leq S_2/S_1 \leq 2$.

15. The image display device of claim 12, wherein an average area $S_1$ of the second contact layer and an average area $S_2$ of the second electrode satisfy a relation of $S_2/S_1 = 1.05$.

16. The image display device of claim 10, wherein the active layer includes a GaInP compound semiconductor layer and is doped with an impurity.

17. The image display device of claim 16, wherein a concentration of an n-type impurity in the active layer is in a range of $5 \times 10^{15}/\text{cm}^3$ to $1 \times 10^{18}/\text{cm}^3$.

18. The image display device of claim 16, wherein:
the first clad layer comprises a first AlGaInP compound semiconductor layer, and
the second clad layer comprises a second AlGaInP compound semiconductor layer.

19. The image display device of claim 18, wherein:
the first compound semiconductor layer is n-type, and
the second compound semiconductor layer is p-type.

20. The method of claim 11, wherein the second contact layer is substantially a same size as the second electrode.

21. The method of claim 11, wherein the second electrode covers the second contact layer.

22. The method of claim 20, wherein an average area $S_1$ of the second contact layer and an average area $S_2$ of the second electrode satisfy a relation of $\frac{1}{2} \leq S_2/S_1 \leq 2$.

23. The method of claim 20, wherein an average area $S_1$ of the second contact layer and an average area $S_2$ of the second electrode satisfy a relation of $S_2/S_1 = 1.05$.

24. The method of claim 11, wherein the active layer includes a GaInP compound semiconductor layer and is doped with an impurity.

25. The method of claim 24, wherein a concentration of an n-type impurity in the active layer is in a range of $5 \times 10^{15}/\text{cm}^3$ to $1 \times 10^{18}/\text{cm}^3$.

26. The method of claim 24, wherein:
the first clad layer comprises a first AlGaInP compound semiconductor layer, and
the second clad layer comprises a second AlGaInP compound semiconductor layer.

27. The method of claim 26, wherein:
the first compound semiconductor layer is n-type, and
the second compound semiconductor layer is p-type.

* * * * *